US00RE46204E

(19) United States
(12) Reissued Patent
Kawaguchi et al.

(10) Patent Number: US RE46,204 E
(45) Date of Reissued Patent: Nov. 15, 2016

(54) SEMICONDUCTOR DEVICE AND DC-DC CONVERTER

(71) Applicant: KABUSHIKI KAISHA TOSHIBA, Tokyo (JP)

(72) Inventors: Yusuke Kawaguchi, Kanagawa (JP); Miwako Akiyama, Tokyo (JP); Yoshihiro Yamaguchi, Saitama (JP); Nobuyuki Sato, Kanagawa (JP); Shigeaki Hayase, Tokyo (JP)

(73) Assignee: Kabushiki Kaisha Toshiba, Tokyo (JP)

(21) Appl. No.: 14/675,258

(22) Filed: Mar. 31, 2015

Related U.S. Patent Documents

Reissue of:
(64) Patent No.: 8,410,546
Issued: Apr. 2, 2013
Appl. No.: 12/408,056
Filed: Mar. 20, 2009

(30) Foreign Application Priority Data

Mar. 28, 2008 (JP) ..... 2008-085359
Feb. 10, 2009 (JP) ..... 2009-028910

(51) Int. Cl.
*H01L 29/76* (2006.01)
*H01L 29/94* (2006.01)
*H01L 29/78* (2006.01)
*H01L 29/423* (2006.01)
(Continued)

(52) U.S. Cl.
CPC ..... *H01L 29/7813* (2013.01); *H01L 29/42368* (2013.01); *H01L 29/66666* (2013.01); *H01L 29/7803* (2013.01); *H01L 29/7811* (2013.01); *H01L 29/7827* (2013.01); *H01L 29/0696* (2013.01); *H02M 3/1588* (2013.01); *Y02B 70/1466* (2013.01)

(58) Field of Classification Search
CPC ..... H01L 29/7803; H01L 29/7813; H01L 29/7827; H01L 29/66666
See application file for complete search history.

(56) References Cited

U.S. PATENT DOCUMENTS 5,792,686 A * 8/1998 Chen et al. ..... 438/244
5,998,833 A * 12/1999 Baliga ..... H01L 21/823487 257/329

(Continued)

FOREIGN PATENT DOCUMENTS

JP 2002026324 A 1/2002
JP A-2002-026324 1/2002

(Continued)

OTHER PUBLICATIONS

Japanese Office Action dated Mar. 7, 2013, filed in Japanese counterpart Application No. 2009-028910, 6 pages (with translation).

(Continued)

*Primary Examiner* — James Menefee
(74) *Attorney, Agent, or Firm* — Patterson & Sheridan, LLP

(57) ABSTRACT

A semiconductor device includes: a semiconductor substrate of a first conductivity type; a semiconductor region provided in the semiconductor substrate; a first trench formed in the semiconductor region; a second trench formed in the semiconductor substrate; a trench gate electrode provided in the first trench; and a trench source electrode provided in the second trench. The trench source electrode is shaped like a stripe and connected to the source electrode through its longitudinal portion.

12 Claims, 17 Drawing Sheets

(51) Int. Cl.

| | |
|---|---|
| ***H01L 29/66*** | (2006.01) |
| *H02M 3/158* | (2006.01) |
| *H01L 29/06* | (2006.01) |

(56) References Cited

U.S. PATENT DOCUMENTS

| | | | | |
|---|---|---|---|---|
| 6,818,945 | B2 | 11/2004 | Kawaguchi et al. | |
| 6,916,745 | B2 * | 7/2005 | Herrick | H01L 29/7813 257/774 |
| 2005/0029585 | A1 * | 2/2005 | He et al. | 257/330 |
| 2005/0045960 | A1 | 3/2005 | Takahashi | |
| 2006/0006432 | A1 * | 1/2006 | Shiraishi | H01L 21/823487 257/288 |
| 2008/0029812 | A1 * | 2/2008 | Bhalla | H01L 29/0878 257/330 |
| 2008/0042208 | A1 * | 2/2008 | Hshieh | H01L 29/66727 257/360 |
| 2008/0087951 | A1 * | 4/2008 | Takaya | H01L 29/0623 257/334 |
| 2009/0179235 | A1 | 7/2009 | Shiraishi et al. | |

FOREIGN PATENT DOCUMENTS

| | | | |
|---|---|---|---|
| JP | 2004507092 | A | 3/2004 |
| JP | A-2004-507092 | | 3/2004 |
| JP | 2004281462 | A | 10/2004 |
| JP | 2005057291 | A | 3/2005 |
| JP | 2005-101514 | A | 4/2005 |
| JP | 2005203766 | A | 7/2005 |
| JP | 2005524970 | A | 8/2005 |
| JP | A-2005-524970 | | 8/2005 |
| JP | 2006025567 | A | 1/2006 |

OTHER PUBLICATIONS

Japanese Office Action dated Dec. 3, 2013, filed in Japanese counterpart Application No. 2009-028910, 4 pages (with translation).

Japanese Office Action dated Nov. 21, 2014, filed in Japanese counterpart Application No. 2014-018931, 6 pages (with translation).

Kinzer, et al.; "Ultra-Low Rdson 12v P-channel trench MOSFET," 1999 Proceedings of ISPSD'99, pp. 303-306, IEEE.

* cited by examiner

SEMICONDUCTOR DEVICE AND DC-DC CONVERTER

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is based upon and claims the benefit of priority from the prior Japanese Patent Application No. 2008-85359, filed on Mar. 28, 2008, and the prior Japanese Patent Application No. 2009-028910, filed on Feb. 10, 2009; the entire contents of which are incorporated herein by reference.

BACKGROUND OF THE INVENTION

1. Field of the Invention

This invention relates to a semiconductor device including trench-gate vertical MOSFETs (metal oxide semiconductor field effect transistors), and a DC-DC converter using this semiconductor device as a switching device.

2. Background Art

Recently, the demand for power MOSFETs has been rapidly increasing not only in the market for switching power supplies operating at high current and high breakdown voltage, but also in the market for energy-saving switching power supplies used in, for example, mobile communication devices such as notebook personal computers. The power MOSFET is used in a power management circuit and a safety circuit for a lithium-ion battery. Hence, the power MOSFET is desired to operate at lower driving voltage and lower on-resistance so that it can be directly driven by battery voltage. Furthermore, to reduce switching loss, reduction of gate-drain capacitance is desired.

In a typical configuration of the power MOSFET, an $n^-$-type epitaxial layer is provided as a buffer layer on an $n^+$-type semiconductor substrate connected to the drain electrode, a p-type base layer is provided on the $n^-$-type epitaxial layer, an $n^+$-type source region is formed partly in an upper portion of the p-type base layer, and a source electrode is connected to the $n^+$-type source region. This configuration further includes a trench extending from the $n^+$-type source region side, penetrating through the $n^+$-type source region and the p-type base layer, and reaching an upper portion of the $n^-$-type epitaxial layer. A gate dielectric film is formed on the inner surface of this trench, and a trench gate electrode is buried inside this trench (see, e.g., JP-A-2005-524970 (Kokai)).

However, in this type of power MOSFET, due to the stray inductance of the circuit including this power MOSFET, the source-drain voltage jumps at turn-off and exceeds the break-down voltage, causing a large loss. This loss can be reduced by providing a capacitor (snubber circuit) between the source and the drain. However, providing such a capacitor increases the number of components. Furthermore, stray inductance occurring between the power MOSFET and the capacitor prevents the current from sufficiently flowing through the snubber circuit and results in the problem of low effectiveness.

SUMMARY OF THE INVENTION

According to an aspect of the invention, there is provided a semiconductor device including: a semiconductor substrate of a first conductivity type; a semiconductor layer of a second conductivity type provided in part of an upper portion of the semiconductor substrate; a semiconductor region of the first conductivity type provided in part of an upper portion of the semiconductor layer; a first trench formed from an upper surface side of the semiconductor region, penetrating through the semiconductor region and the semiconductor layer, and reaching the semiconductor substrate; a second trench formed outside the semiconductor layer in the semiconductor substrate from an upper surface side thereof; a gate dielectric film formed on an inner surface of the first trench; a trench gate electrode provided on the gate dielectric film; a capacitive dielectric film formed on an inner surface of the second trench; a trench source electrode provided on the capacitive dielectric film; a drain electrode provided on a lower surface of the semiconductor substrate; and a source electrode provided on an upper surface of the semiconductor layer, the trench source electrode extending in a direction parallel to the upper surface of the semiconductor substrate and being connected to the source electrode through a portion of the trench source electrode in the parallel direction.

According to another aspect of the invention, there is provided a DC-DC converter including: a high-side field effect transistor and a low-side field effect transistor connected in series between a positive reference potential and a negative reference potential; and an LC filter connected between an output terminal and the junction of the high-side field effect transistor and the low-side field effect transistor, at least one of the high-side field effect transistor and the low-side field effect transistor including: a semiconductor substrate of a first conductivity type; a semiconductor layer of a second conductivity type provided in part of an upper portion of the semiconductor substrate; a semiconductor region of the first conductivity type provided in part of an upper portion of the semiconductor layer; a first trench formed from an upper surface side of the semiconductor region, penetrating through the semiconductor region and the semiconductor layer, and reaching the semiconductor substrate; a second trench formed outside the semiconductor region in the semiconductor substrate from an upper surface side thereof; a gate dielectric film formed on an inner surface of the first trench; a trench gate electrode provided on the gate dielectric film; a capacitive dielectric film formed on an inner surface of the second trench; a trench source electrode provided on the capacitive dielectric film; a drain electrode provided on a lower surface of the semiconductor substrate; and a source electrode provided on an upper surface of the semiconductor layer, and the trench source electrode extending in a direction parallel to the upper surface of the semiconductor substrate and being connected to the source electrode through a portion of the trench source electrode in the parallel direction.

According to still another aspect of the invention, there is provided a semiconductor device including: a semiconductor substrate of a first conductivity type; a semiconductor layer of a second conductivity type provided on the semiconductor substrate and being in contact with the semiconductor substrate; a semiconductor region of the first conductivity type provided in part of an upper portion of the semiconductor layer; a trench formed from an upper surface side of the semiconductor region, penetrating through the semiconductor region and the semiconductor layer, and reaching the semiconductor substrate; a gate dielectric film formed on an inner surface of the trench; a trench gate electrode provided inside the trench; a drain electrode provided on a lower surface of the semiconductor substrate; and a source electrode provided on an upper surface of the semiconductor layer, the thickness of a portion of the gate dielectric film formed on a bottom surface of the trench being different from the thickness of a portion of the gate dielectric film formed on a side surface of the trench.

DETAILED DESCRIPTION OF THE INVENTION

Embodiments of the invention will now be described with reference to the drawings.

To begin with, a first embodiment of the invention is described.

Figure 1:
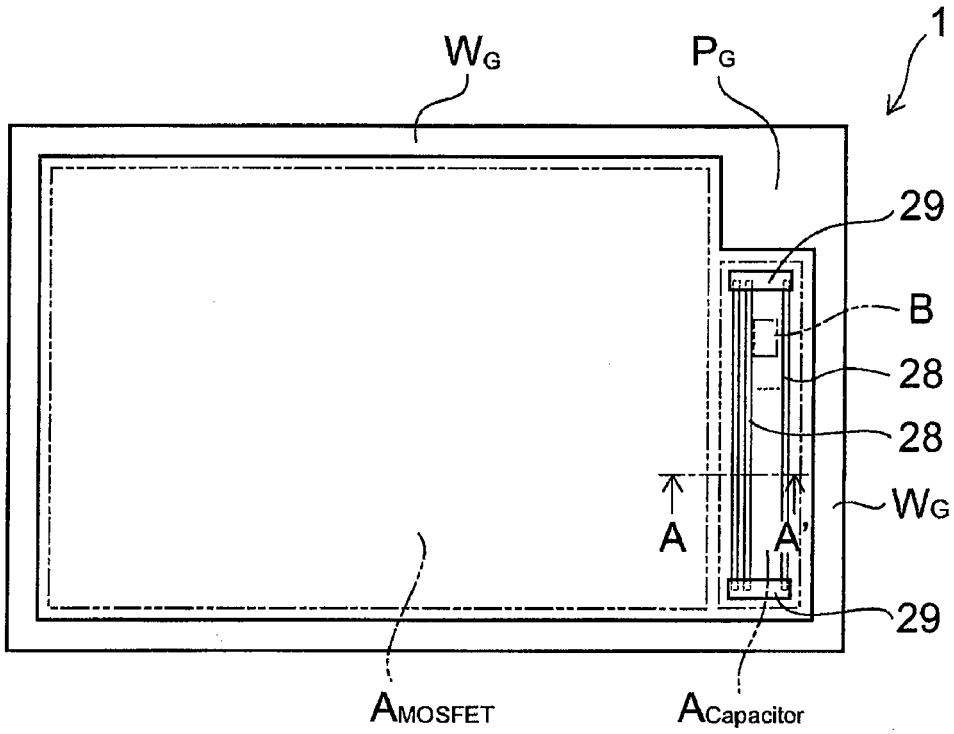
FIG. 1 is a schematic plan view illustrating a semiconductor device according to a first embodiment of the invention.

FIG. 1 is a schematic plan view illustrating a semiconductor device according to this embodiment.

Figure 2:
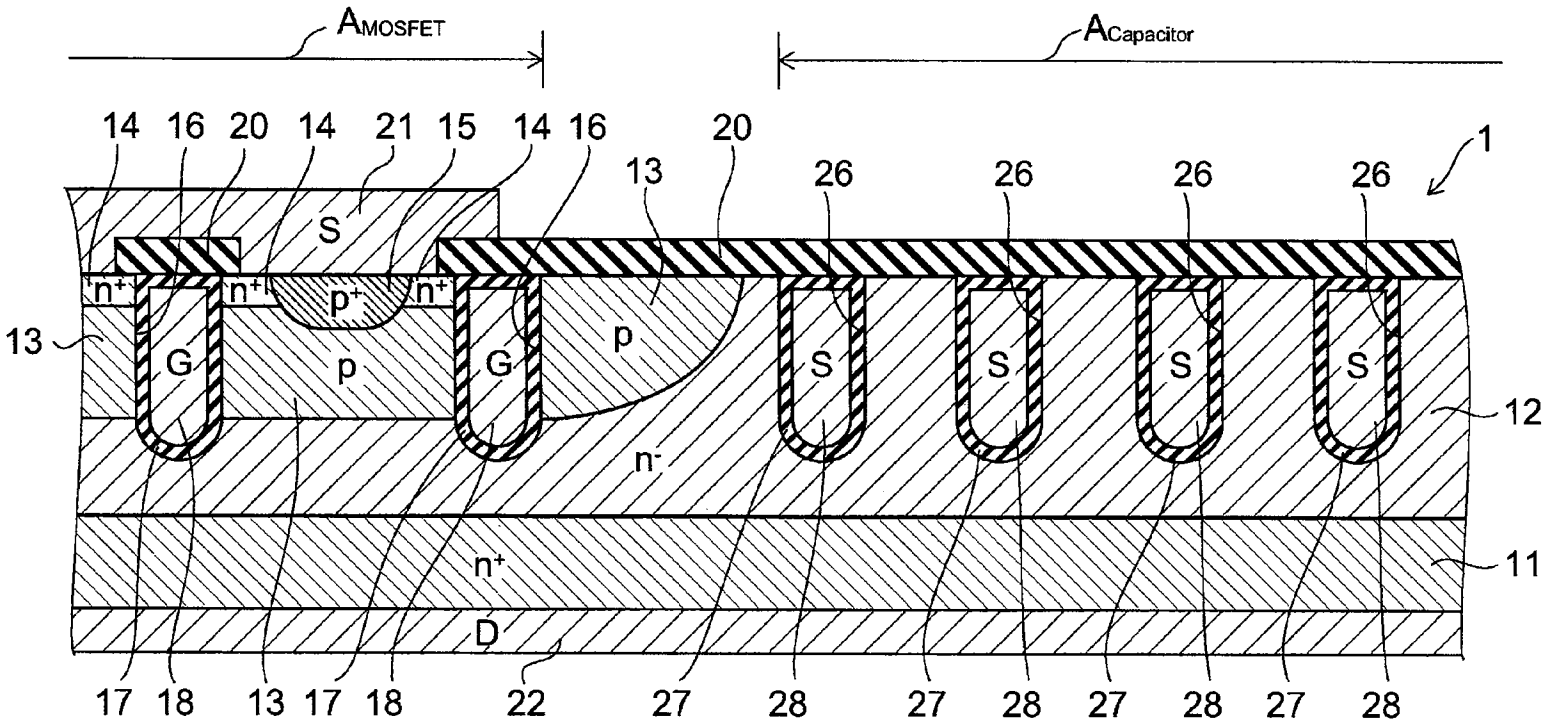
FIG. 2 is a cross-sectional view taken along line A-A' shown in FIG. 1.

FIG. 2 is a cross-sectional view taken along line A-A' shown in FIG. 1.

Figure 3:
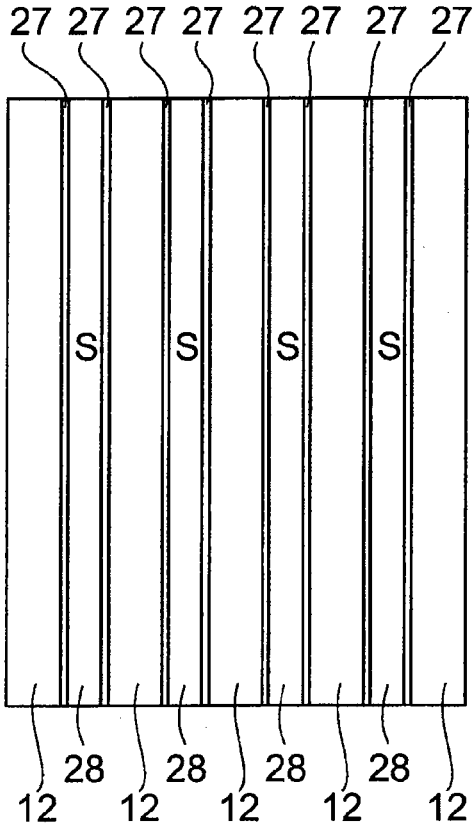
FIG. 3 is a partially enlarged plan view illustrating region B shown in FIG. 1.

FIG. 3 is a partially enlarged plan view illustrating region B shown in FIG. 1.

The semiconductor device according to this embodiment is a semiconductor device including a vertical power MOSFET and a snubber circuit on one chip.

As shown in FIG. 1, the semiconductor device 1 according to this embodiment is configured as one chip. This chip has a rectangular outline as viewed from the frontside, and is provided with a rectangular gate pad $P_G$ at one corner on the surface. A gate wiring $W_G$ extends out of the gate pad $P_G$ along the outer periphery of the chip and constitutes a frame-like gate electrode. Of the two rectangular regions constituting the L-shaped region surrounded by the gate pad $P_G$ and the gate wiring $W_G$ in the semiconductor device 1, the larger rectangular region is a MOSFET region $A_{MOSFET}$ to be populated with MOSFETs, and the smaller rectangular region is a capacitor region $A_{Capacitor}$ to be populated with capacitors.

As shown in FIG. 2, the semiconductor device 1 includes an $n^+$-type substrate 11 made of a semiconductor material having $n^+$-type conductivity, and an $n^-$-type epitaxial layer 12 made of a semiconductor material having $n^-$-type conductivity is formed on the $n^+$-type substrate 11. The $n^-$-type epitaxial layer 12 is formed by epitaxial growth on the $n^+$-type substrate 11, and the $n^+$-type substrate 11 and the $n^-$-type epitaxial layer 12 constitute a semiconductor substrate. The $n^-$-type epitaxial layer 12 has a higher resistivity than the $n^+$-type substrate 11. Hence, the $n^+$-type substrate 11 constitutes a low-resistance layer of the semiconductor substrate, and the $n^-$-type epitaxial layer 12 constitutes a high-resistance layer of the semiconductor substrate.

In an upper portion of the $n^-$-type epitaxial layer 12 located in the MOSFET region $A_{MOSFET}$, a semiconductor layer having p-type conductivity (hereinafter referred to as "p-type base layer 13") is formed. Furthermore, a semiconductor region having $n^+$-type conductivity (hereinafter referred to as "$n^+$-type source region 14") is formed in part of the upper portion of the p-type base layer 13, and a $p^+$-type region 15 having $p^+$-conductivity is formed in another part of the upper portion of the p-type base layer 13. The $n^+$-type source region 14 and the $p^+$-type region 15 are in contact with each other. As viewed from above, that is, in the direction perpendicular to the upper surface of the semiconductor substrate, the $n^+$-type source region 14 and the $p^+$-type region 15 are each shaped like a stripe and alternately arranged.

In the MOSFET region $A_{MOSFET}$, a plurality of trenches 16 are formed from the upper surface side of the $n^+$-type source region 14. The trench 16 penetrates through the $n^+$-type source region 14 and the p-type base layer 13 and reaches an upper portion of the $n^-$-type epitaxial layer 12. As viewed from above, the trench 16 extends like a stripe in the extending direction of the $n^+$-type source region 14. In the following, the extending direction of the trench 16 is referred to as "trench direction". The trench direction is a direction parallel to the upper surface of the semiconductor substrate.

A gate dielectric film 17 is formed entirely on the inner surface of the trench 16, and a trench gate electrode 18 is buried on the gate dielectric film 17, that is, inside the trench 16. Thus, the trench gate electrode 18 is insulated from the $n^-$-type epitaxial layer 12, the p-type base layer 13, and the $n^+$-type source region 14 by the gate dielectric film 17. The bottom of the trench gate electrode 18 is located below the interface between the $n^-$-type epitaxial layer 12 and the p-type base layer 13.

On the other hand, in an upper portion of the $n^-$-type epitaxial layer 12 located in the capacitor region $A_{Capacitor}$, a plurality of trenches 26 are formed from the upper surface side. It is noted that the capacitor region $A_{Capacitor}$ is located outside the p-type base layer 13. The trench 26 extends in the aforementioned trench direction, that is, the extending direction of the trench 16. The lower end of the trench 26 does not reach the interface between the $n^+$-type substrate 11 and the $n^-$-type epitaxial layer 12, but is located in the $n^-$-type epitaxial layer 12. A capacitive dielectric film 27 is formed on the inner surface of the trench 26, and a trench source electrode 28 is provided on the capacitive dielectric film 27, that is, in the trench 26.

For example, the trench 26, the capacitive dielectric film 27, and the trench source electrode 28 in the capacitor region $A_{Capacitor}$ are formed in the same process as the trench 16, the gate dielectric film 17, and the trench gate electrode 18 in the MOSFET region $A_{MOSFET}$, respectively. Hence, the depth of the trench 26 is equal to the depth of the trench 16. That is, in the height direction, the bottom position of the trench 26 is equal to the bottom position of the trench 16. Furthermore, the thickness of the capacitive dielectric film 27 is equal to the thickness of the gate dielectric film 17.

Furthermore, on the semiconductor substrate, a dielectric film 20 is provided so as to overlap the upper surface of the semiconductor substrate. In the MOSFET region $A_{MOSFET}$, the dielectric film 20 is formed so as to cover the immediately overlying region and its surroundings of the trench 16 and not to cover the $p^+$-type region 15 and part of the $n^+$-type source region 14. In the capacitor region $A_{Capacitor}$, the dielectric film 20 is formed so as to cover the entire surface.

Furthermore, in the MOSFET region $A_{MOSFET}$ on the semiconductor substrate, a source electrode 21 is provided so as to cover the dielectric film 20. The source electrode 21 is in contact with the $n^+$-type source region 14 and the $p^+$-type region 15, and hence connected to the $n^+$-type source region 14 and the $p^+$-type region 15, but isolated from the trench gate electrode 18 by the dielectric film 20. The trench gate electrode 18 is connected, at both longitudinal end portions thereof, to the gate wiring $W_G$ (see FIG. 1).

As shown in FIG. 3, as viewed from above, the trench source electrode 28 is shaped like a stripe extending in the trench direction. It is noted that the dielectric film 20 (see FIG. 2) is not shown in FIG. 3. The trench source electrode 28 is connected, at both longitudinal end portions thereof, to source contacts 29 (see FIG. 1). The source contact 29 is connected to the source electrode 21. On the other hand, the upper surface of the longitudinal intermediate portion of the trench source electrode 28 is covered with the dielectric film 20, and not in contact with the source contacts 29 and the source electrode 21. Thus, the trench source electrode 28 is connected through part of its longitudinal portion to the source electrode 21. In this embodiment, the trench source electrode 28 is connected through its both end portions and the source contacts 29 to the source electrode 21.

On the other hand, as shown in FIG. 2, a drain electrode 22 is provided entirely on the lower surface of the $n^+$-type substrate 11. The drain electrode 22 is in contact with the lower surface of the $n^+$-type substrate 11, and hence connected to the $n^+$-type substrate 11.

By way of example, the $n^+$-type substrate 11, the $n^-$-type epitaxial layer 12, the p-type base layer 13, the $n^+$-type source region 14, and the $p^+$-type region 15 are formed from single crystal silicon (Si) doped with donors such as phosphorus (P) or acceptors such as boron (B), the gate dielectric film 17 and the capacitive dielectric film 27 are formed from silicon oxide, and the trench gate electrode 18 and the trench source electrode 28 are formed from polycrystalline silicon. The $n^+$-type substrate 11 has a donor concentration of e.g. $1\times10^{19}$ $cm^{-3}$ or more, and the $n^-$-type epitaxial layer 12 has a donor concentration of e.g. $1\times10^{17}$ $cm^{-3}$ or less. The gate pad $P_G$, the gate wiring $W_G$, the source contact 29, the source electrode 21, and the drain electrode 22 are formed from a metal such as copper (Cu) or aluminum (Al), or an alloy thereof.

Next, the operation of this embodiment is described.

Figure 4:
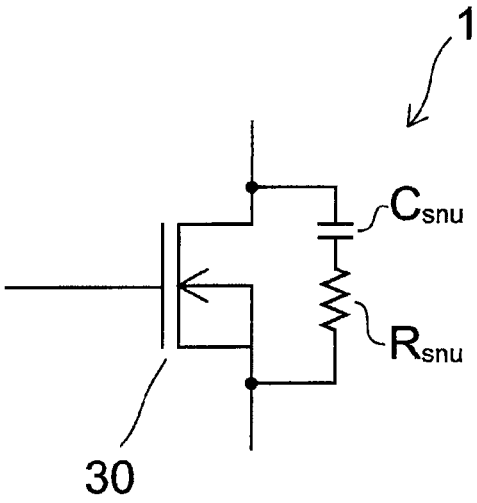
FIG. 4 is a circuit diagram illustrating the semiconductor device according to the first embodiment.

FIG. 4 is a circuit diagram illustrating the semiconductor device according to this embodiment.

As shown in FIGS. 2 and 4, in the MOSFET region $A_{MOSFET}$, a vertical MOSFET 30 is formed between the source electrode 21 and the drain electrode 22, where the $n^+$-type source region 14 serves as a source, the p-type base layer 13 serves as a channel, the $n^+$-type substrate 11 serves as a drain, and the trench gate electrode 18 serves as a gate.

In the capacitor region $A_{Capacitor}$, a capacitor $C_{snu}$ is formed, where the trench source electrode 28 connected to the source electrode 21 serves as one electrode, the $n^-$-type epitaxial layer 12 connected to the drain electrode 22 serves as the other electrode, and the capacitive dielectric film 27 serves as a capacitive dielectric film. The capacitor $C_{snu}$ is connected between the source and the drain of the vertical MOSFET 30.

Furthermore, because the trench source electrode 28 is connected to the source electrode 21 only through both longitudinal end portions thereof, a stray resistance $R_{snu}$ occurs between the trench source electrode 28 serving as one electrode of the capacitor $C_{snu}$ and the $n^+$-type source region 14 serving as the source of the vertical MOSFET 30. As shown in FIG. 4, in the equivalent circuit of the semiconductor device 1, the stray resistance $R_{snu}$ is connected in series to the capacitor $C_{snu}$.

Moreover, because the vertical MOSFET 30 and the capacitor $C_{snu}$ are formed on the same semiconductor chip, the stray inductance between the vertical MOSFET 30 and the capacitor $C_{snu}$ is extremely small.

Next, the effect of this embodiment is described.

Figure 5:
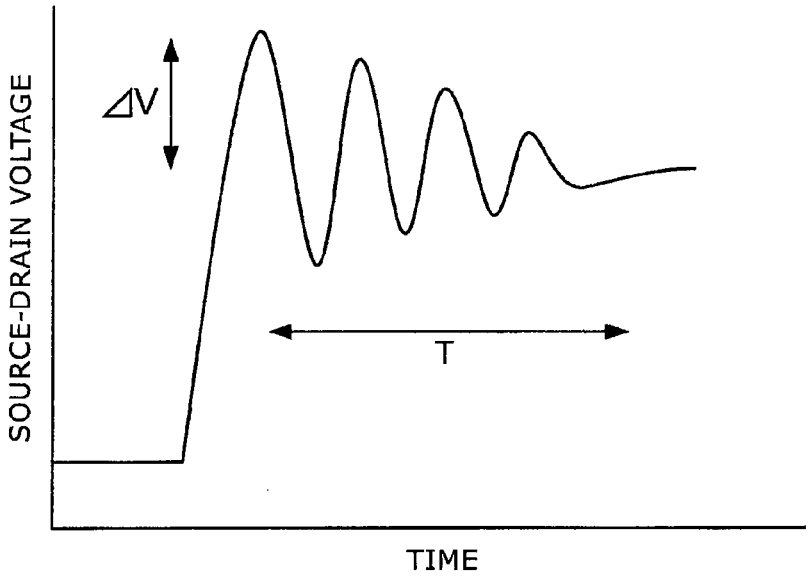
FIG. 5 is a graph illustrating the variation of source-drain voltage at the time of turning off the vertical MOSFET.

FIG. 5 is a graph illustrating the variation of source-drain voltage at the time of turning off the vertical MOSFET, where the horizontal axis represents time, and the vertical axis represents the source-drain voltage of the vertical MOSFET.

As shown in FIG. 5, when the vertical MOSFET 30 is transitioned from the on-state to the off-state, the source-drain voltage of the vertical MOSFET jumps due to the stray inductance of the circuit having the vertical MOSFET 30 incorporated. This phenomenon is referred to as "spike phenomenon". As shown in FIG. 5, when a spike phenomenon occurs, the source-drain voltage oscillates, but is attenuated and eventually converged to a certain value. The maximum amount of variation of the source-drain voltage to this converged value is referred to as spike amount ΔV. Then, as given by the following equation, the spike amount ΔV is proportional to the stray inductance Ls and the rate of change of the current, di/dt:

$$\Delta V = -Ls \times (di/dt)$$

When the voltage V reaches the breakdown voltage of the vertical MOSFET 30 by the spike phenomenon, an avalanche breakdown occurs in the vicinity of the trench gate electrode 18 in the p-type base layer 13, causing a large switching loss. Furthermore, during the time T until the source-drain voltage converges to a certain value, electromagnetic noise is emitted from the stray inductance on the circuit.

In the semiconductor device 1 according to this embodiment, the capacitor $C_{snu}$ is connected between the source and the drain of the vertical MOSFET 30, and thereby serves as a snubber circuit of the vertical MOSFET 30. That is, the spike amount ΔV can be reduced by providing the capacitor $C_{snu}$. Here, the vertical MOSFET 30 and the capacitor $C_{snu}$ are formed on the same semiconductor chip. Thus, the stray inductance between the vertical MOSFET 30 and the capacitor $C_{snu}$ is reduced, allowing the spike current to efficiently flow through the snubber circuit made of the capacitor $C_{snu}$. Consequently, the snubber circuit functions effectively. Furthermore, the increase of the spike amount ΔV due to the presence of the snubber circuit can be reduced.

Furthermore, because of the stray resistance $R_{snu}$ added between the trench source electrode 28 serving as one electrode of the capacitor $C_{snu}$ and the $n^+$-type source region 14 serving as the source of the vertical MOSFET 30, the oscillation of the source-drain voltage due to the spike phenomenon can be rapidly attenuated. That is, the attenuation time T shown in FIG. 5 can be reduced by providing the stray resistance $R_{snu}$. This serves to reduce the emitted electromagnetic noise.

Furthermore, in this embodiment, the capacitor $C_{snu}$ is not external to the vertical MOSFET 30, and hence serves to reduce the cost of the semiconductor device 1.

In contrast, if the snubber circuit is formed in a semiconductor chip that is separate from the semiconductor chip including the vertical MOSFET 30, a large stray inductance occurs between the vertical MOSFET and the snubber circuit. Thus, little current flows through the snubber circuit, and the effect of preventing the spike phenomenon is hardly achieved. Furthermore, the spike amount ΔV increases due to the stray inductance between the vertical MOSFET and the snubber circuit. Moreover, because the capacitor $C_{snu}$ is external to the vertical MOSFET 30, the cost increases.

Next, a second embodiment of the invention is described.

Figure 6:
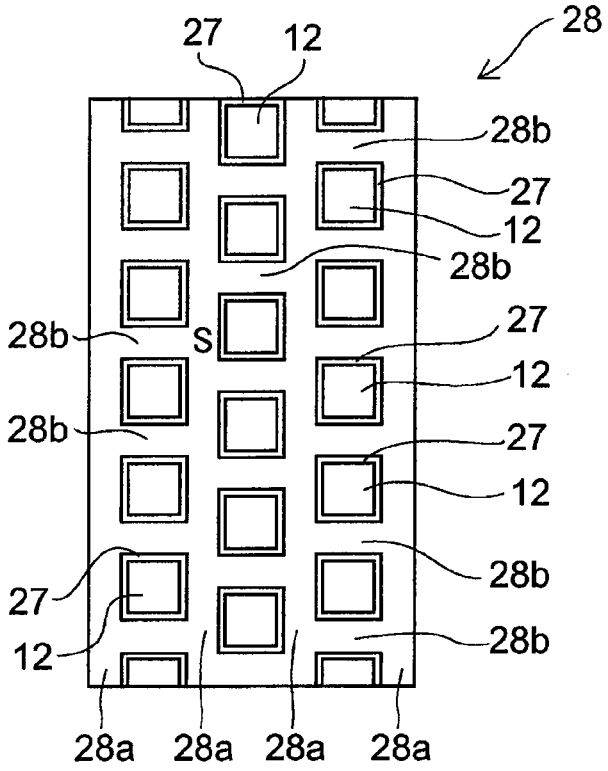
FIG. 6 is a partially enlarged plan view illustrating the trench gate electrode of a semiconductor device according to a second embodiment of the invention.

FIG. 6 is a partially enlarged plan view illustrating the trench gate electrode of a semiconductor device according to this embodiment.

The region shown in FIG. 6 corresponds to the region B shown in FIG. 1. In FIG. 6, the dielectric film 20 (see FIG. 2) is not shown.

As shown in FIG. 6, in the semiconductor device according to this embodiment, as viewed from above, the trench gate electrode 28 is shaped like a mesh. That is, the trench gate electrode 28 is composed of a plurality of striped portions 28a extending in the trench direction and a plurality of portions 28b extending in the direction orthogonal to the trench direction and interconnecting the portions 28a. Thus, as compared with the above first embodiment, the area of the capacitive dielectric film 27 can be increased, and the capacitance of the capacitor $C_{snu}$ per unit area in the capacitor region $A_{Capacitor}$ can be increased. Consequently, the jump of the source-drain voltage at turn-off can be prevented more effectively.

The configuration, operation, and effect other than the foregoing in this embodiment are the same as those in the above first embodiment. The shape of the trench source electrode is not limited to the aforementioned stripe and mesh, but various shapes can be used.

Next, a third embodiment of the invention is described.

Figure 7:
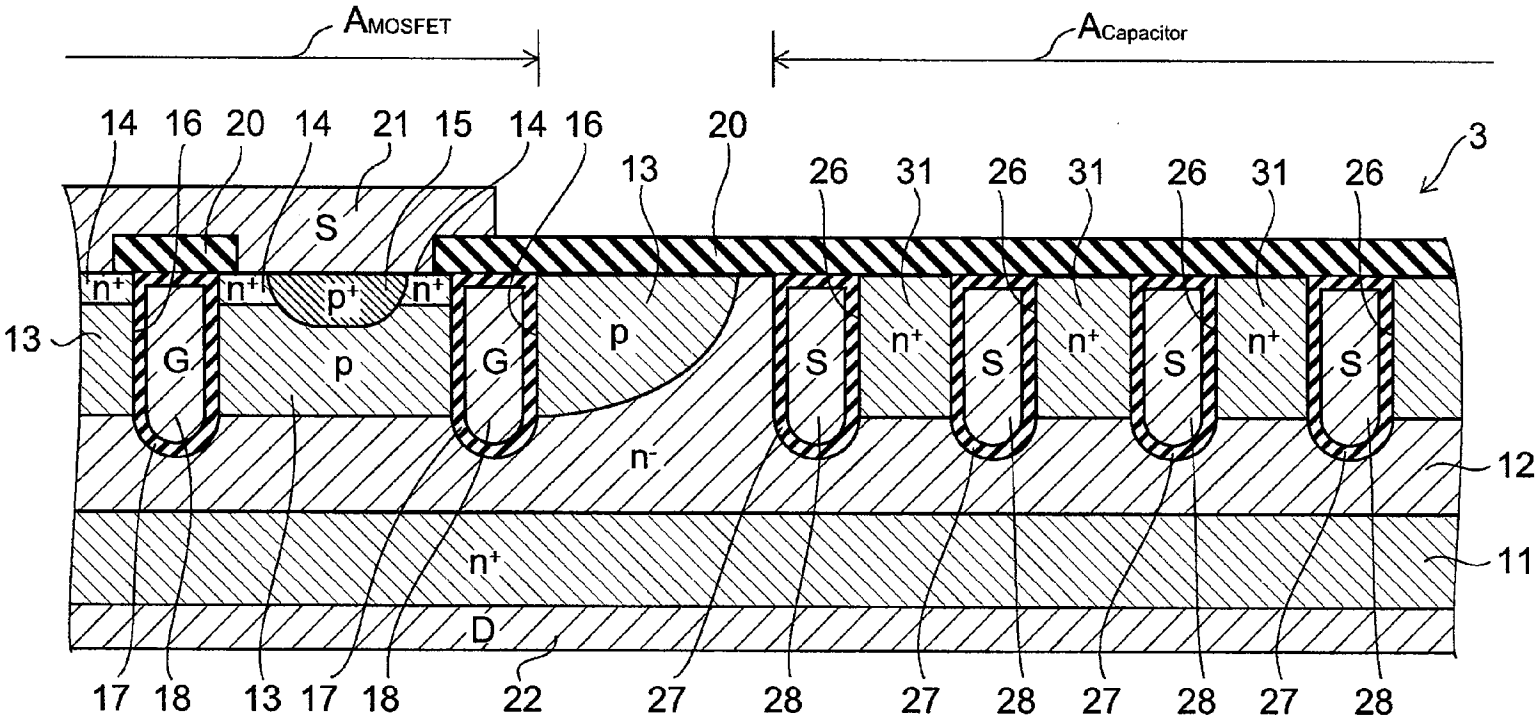
FIG. 7 is a cross-sectional view illustrating a semiconductor device according to a third embodiment of the invention.

FIG. 7 is a cross-sectional view illustrating a semiconductor device according to this embodiment.

As shown in FIG. 7, the semiconductor device 3 according to this embodiment is different from the semiconductor device 1 (see FIG. 2) according to the above first embodiment in that an $n^+$-type layer 31 is formed in an upper portion of the $n^-$-type epitaxial layer 12 in the capacitor region $A_{Capacitor}$. Thus, the $n^+$-type layer 31 is located between the trenches 26. The lower surface of the $n^+$-type layer 31 is located above the lower end portion of the trench 26. The $n^+$-type layer 31 has a higher effective donor concentration than the $n^-$-type epitaxial layer 12, and serves as a low-resistance layer (another low-resistance layer) with respect to the $n^-$-type epitaxial layer 12 (high-resistance layer). The $n^+$-type layer 31 can be formed by additional ion implantation into the capacitor region $A_{Capacitor}$.

According to this embodiment, the $n^+$-type layer 31 having a higher donor concentration than the $n^-$-type epitaxial layer 12 is provided between the trenches 26. Hence, when a voltage is applied between the trench source electrode 28 serving as a negative electrode and the drain electrode 22 serving as a positive electrode, the depletion layer originating from the side surface of the trench 26 is difficult to spread into the $n^+$-type layer 31. Thus, the increase of the effective interelectrode distance of the capacitor $C_{snu}$ due to the formation of the depletion layer can be prevented, and the decrease of capacitance of the capacitor can be prevented. That is, the capacitance of the capacitor $C_{snu}$ can be increased by the $n^+$-type layer 31 while ensuring the breakdown voltage by the $n^-$-type epitaxial layer 12. Consequently, it is possible to provide a semiconductor device with a snubber circuit having a higher capacitance than that in the first embodiment. The configuration, operation, and effect other than the foregoing in this embodiment are the same as those in the above first embodiment.

Next, a fourth embodiment of the invention is described.

Figure 8:
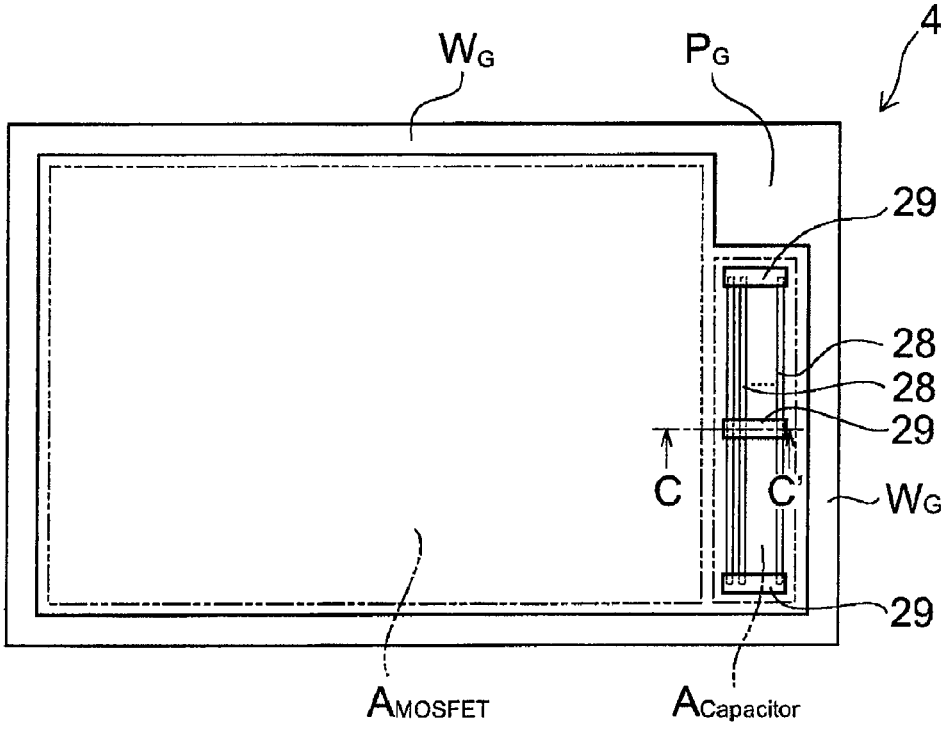
FIG. 8 is a schematic plan view illustrating a semiconductor device according to a fourth embodiment of the invention.

FIG. 8 is a schematic plan view illustrating a semiconductor device according to this embodiment.

Figure 9:
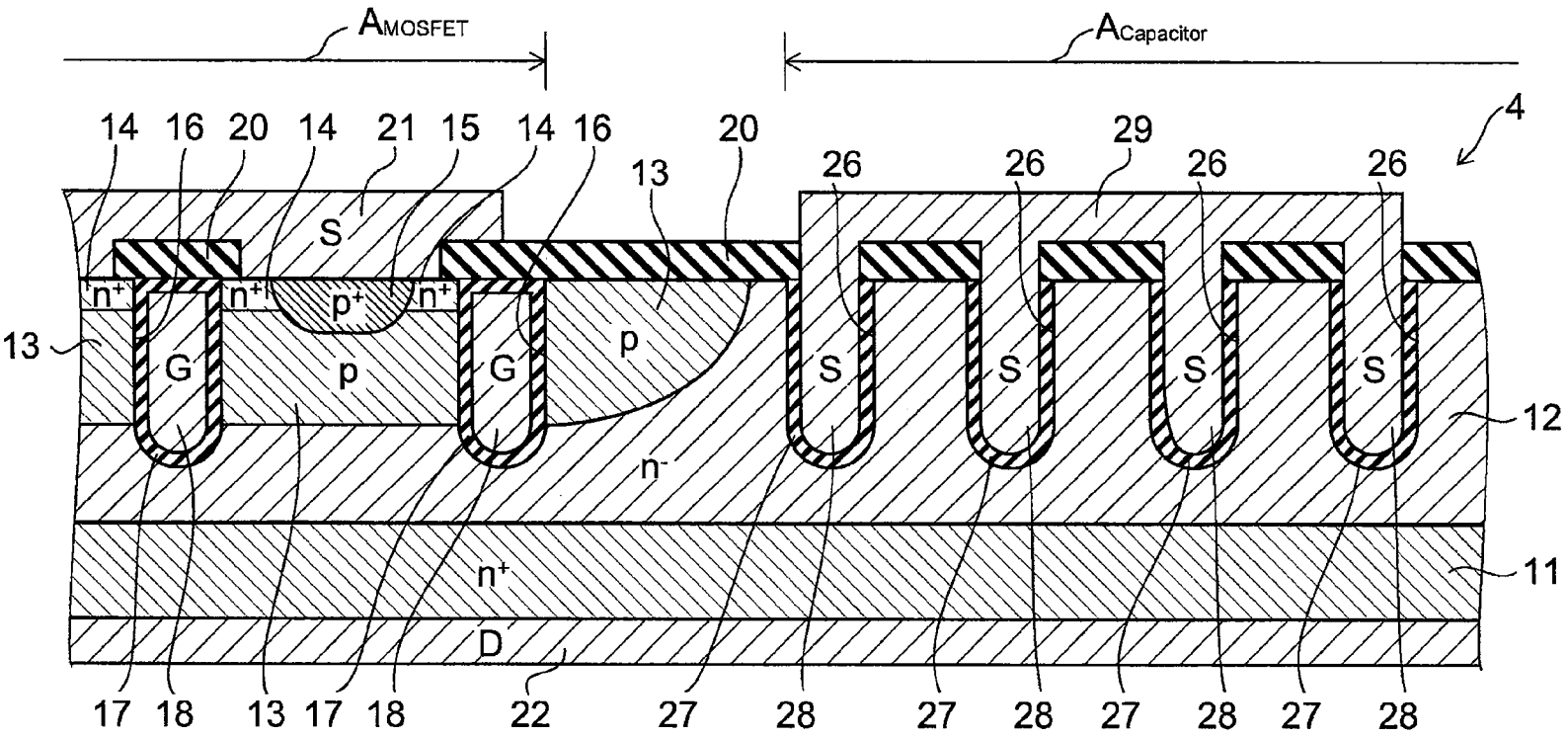
FIG. 9 is a cross-sectional view taken along line C-C' shown in FIG. 8.

FIG. 9 is a cross-sectional view taken along line C-C' shown in FIG. 8.

As shown in FIGS. 8 and 9, in the semiconductor device 4 according to this embodiment, a total of three source contacts 29 are provided immediately above both end portions and immediately above the center portion in the longitudinal direction (trench direction) of the trench source electrode 28. Thus, the trench source electrode 28 is connected to the source electrode 21 through a total of three locations, that is, both end portions and the center portion. Consequently, in the semiconductor device 4 according to this embodiment, the stray resistance $R_{snu}$ can be reduced relative to the semiconductor device 1 (see FIG. 2) according to the above first embodiment. Thus, by suitably selecting the number and layout of the source contacts 29, the magnitude of the stray resistance $R_{snu}$ occurring between the trench source electrode 28 and the $n^+$-type source region 14 can be arbitrarily controlled.

The configuration, operation, and effect other than the foregoing in this embodiment are the same as those in the above first embodiment. The number of source contacts 29 is not limited to two or three, but may be one, or four or more. Furthermore, the position where the trench source electrode 28 is in contact with the source contact 29 is not limited to both end portions and the center portion in the longitudinal direction of the trench source electrode 28, but may be optimized in accordance with the magnitude of the stray resistance $R_{snu}$ to be added.

Next, a fifth embodiment of the invention is described.

Figure 10:
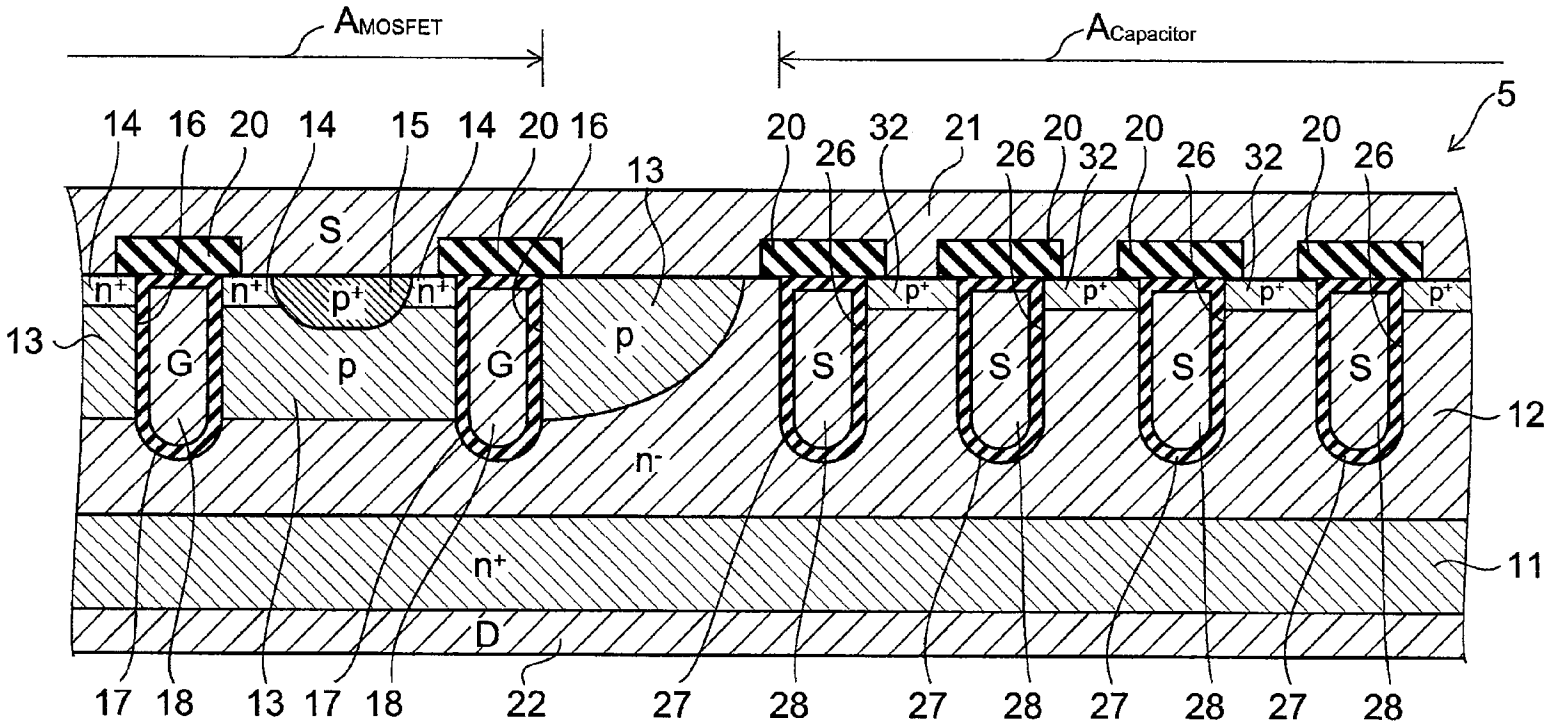
FIG. 10 is a cross-sectional view illustrating a semiconductor device according to a fifth embodiment of the invention.

FIG. 10 is a cross-sectional view illustrating a semiconductor device according to this embodiment.

As shown in FIG. 10, in the semiconductor device 5 according to this embodiment, the source electrode 21 is provided not only in the MOSFET region $A_{MOSFET}$, but also in the capacitor region $A_{Capacitor}$. Furthermore, a $p^+$-type layer 32 having $p^+$-type conductivity is formed between the trenches 26 in the uppermost portion of the $n^-$-type epitaxial layer 12. Moreover, in part of the immediately overlying region of each $p^+$-type layer 32, the dielectric film 20 is not formed. As a result, the $p^+$-type layer 32 is in contact with the source electrode 21.

The configuration and operation other than the foregoing in this embodiment are the same as those in the above first embodiment. Also in this embodiment, like the above first embodiment, a capacitor and a stray resistance connected in series to the vertical MOSFET can be formed in the same chip as the vertical MOSFET.

Next, a sixth embodiment of the invention is described.

Figure 11:
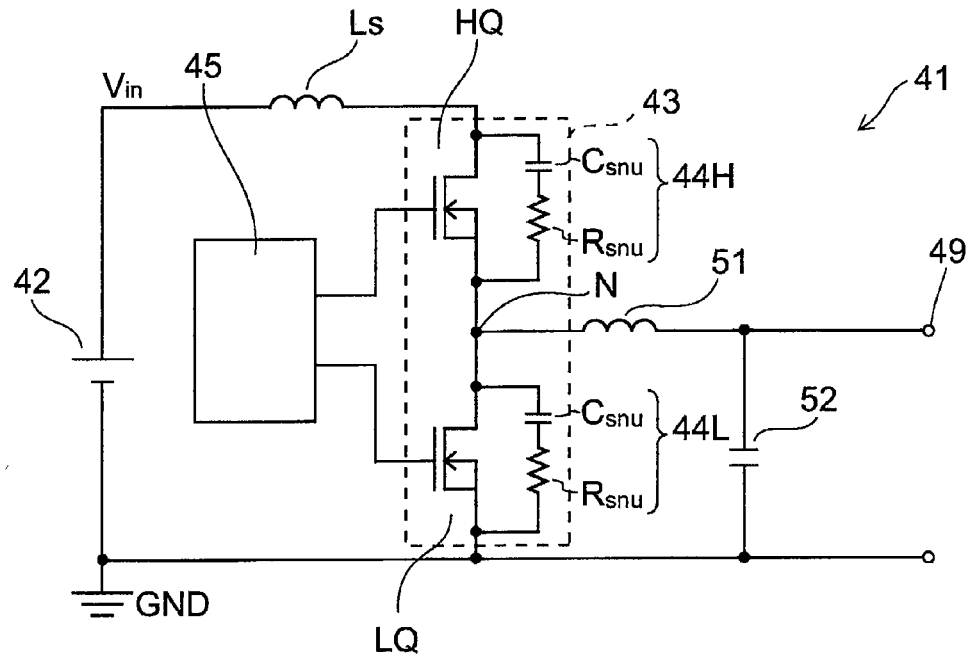
FIG. 11 is a circuit diagram illustrating a DC-DC converter according to a sixth embodiment of the invention.

FIG. 11 is a circuit diagram illustrating a DC-DC converter according to this embodiment.

This embodiment relates to a DC-DC converter.

As shown in FIG. 11, the DC-DC converter 41 according to this embodiment includes a DC power supply 42. The potential of the negative electrode of the DC power supply 42 is a negative reference potential, such as the ground potential GND. The potential of the positive electrode of the DC power supply 42 is a positive reference potential, such as the input potential $V_{in}$. An output circuit 43 is connected between the positive electrode and the negative electrode of the DC power supply 42, that is, between the input potential $V_{in}$ and the ground potential GND.

In the output circuit 43, a high-side transistor HQ illustratively made of an N-type MOSFET and a low-side transistor LQ illustratively made of an N-type MOSFET are connected in series. Thus, the input potential $V_{in}$ is applied to the drain of the high-side transistor HQ, the source of the high-side transistor HQ is connected to the drain of the low-side transistor LQ, and the ground potential GND is applied to the source of the low-side transistor LQ. A snubber circuit 44H is connected in parallel to the high-side transistor HQ, and a snubber circuit 44L is connected in parallel to the low-side transistor LQ.

The DC-DC converter 41 further includes a control circuit 45 for controlling the output circuit 43. The control circuit 45 controls the gate potential of the high-side transistor HQ and the gate potential of the low-side transistor LQ to switch conduction/non-conduction of each of the transistors HQ and LQ. The control circuit 45 illustratively includes a PWM (pulse width modulation) control circuit (not shown) for outputting a control signal and a plurality of stages of CMOS circuits (not shown) for amplifying the control signal outputted from the PWM control circuit.

Moreover, the DC-DC converter 41 includes an inductor 51 and a capacitor 52. The inductor 51 is connected between the output terminal 49 and the junction N of the high-side transistor HQ and the low-side transistor LQ, and the capacitor 52 is connected between the output terminal 49 and the ground potential GND. Thus, the inductor 51 and the capacitor 52 constitute an LC circuit.

In the DC-DC converter 41, the high-side transistor HQ and the snubber circuit 44H are made of the semiconductor device 1 according to the above first embodiment. That is, the high-side transistor HQ is made of the vertical MOSFET 30, and the snubber circuit 44H is made of the capacitor $C_{snu}$ and the stray resistance $R_{snu}$. Likewise, the low-side transistor LQ and the snubber circuit 44L are also made of the semiconductor device 1 according to the first embodiment. Thus, in the DC-DC converter 41, the semiconductor device 1 is used as a switching device of the output circuit 43.

Next, the operation and effect of this embodiment are described.

Upon operation of the DC-DC converter 41, when the high-side transistor HQ and the low-side transistor LQ are each turned off, a stray inductance Ls occurs in the current path connecting from the DC power supply 42 through the high-side transistor HQ, the junction N, and the low-side transistor LQ to the DC power supply 42.

However, in this embodiment, the snubber circuits 44H and 44L are formed on the same chip as the high-side transistor HQ and the low-side transistor LQ, respectively. Hence, by the operation described in the above first embodiment, the spike phenomenon can be prevented in both the high-side transistor HQ and the low-side transistor LQ, and the variation of source-drain voltage can be prevented. It is noted that the effect of the stray inductance Ls on the spike amount $\Delta V$ is equivalent irrespective of where in the above current path it occurs. In FIG. 11, for convenience, the stray inductance Ls is shown between the positive electrode of the DC power supply 42 and the high-side transistor HQ. The same also applies to the other figures described below.

Next, a seventh embodiment of the invention is described.

Figure 12:
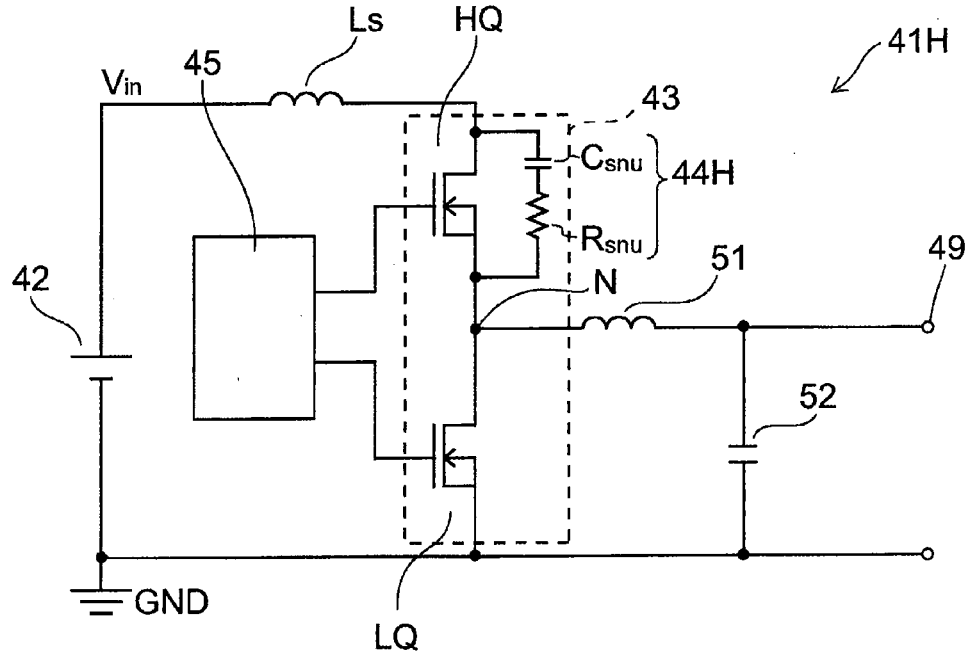
FIG. 12 is a circuit diagram illustrating a DC-DC converter according to a seventh embodiment of the invention.

FIG. 12 is a circuit diagram illustrating a DC-DC converter according to this embodiment.

As shown in FIG. 12, in the DC-DC converter 41H according to this embodiment, a snubber circuit 44H is connected only to the high-side transistor HQ, and no snubber circuit is connected to the low-side transistor LQ. That is, only the high-side transistor HQ and the snubber circuit 44H are made of the semiconductor device 1 according to the above first embodiment. In this embodiment, the spike phenomenon occurring in the high-side transistor HQ can be prevented. The configuration, operation, and effect other than the foregoing in this embodiment are the same as those in the above sixth embodiment.

Next, an eighth embodiment of the invention is described.

Figure 13:
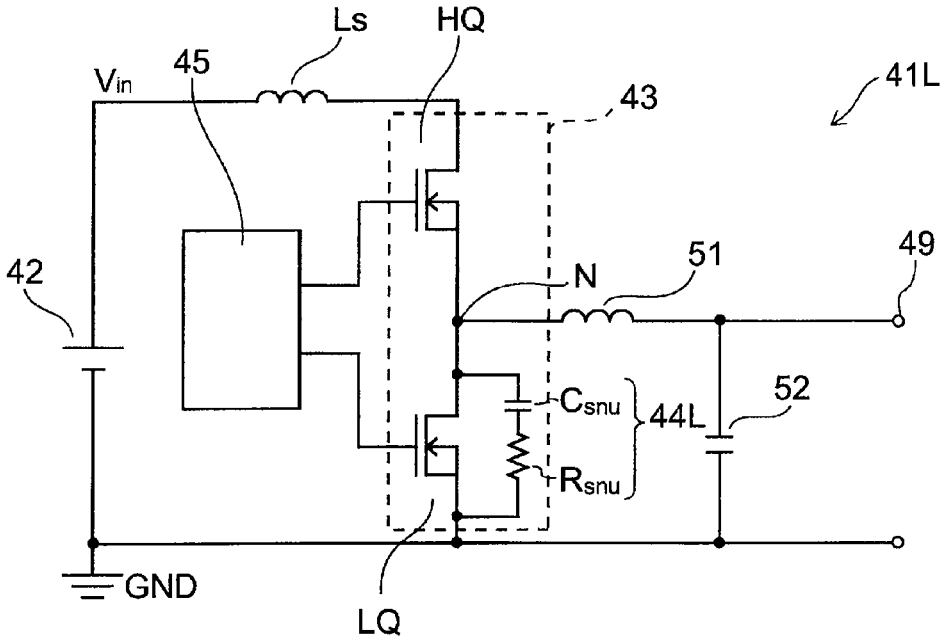
FIG. 13 is a circuit diagram illustrating a DC-DC converter according to an eighth embodiment of the invention.

FIG. 13 is a circuit diagram illustrating a DC-DC converter according to this embodiment.

As shown in FIG. 13, in the DC-DC converter 41L according to this embodiment, a snubber circuit 44L is connected only to the low-side transistor LQ, and no snubber circuit is connected to the high-side transistor HQ. That is, only the low-side transistor LQ and the snubber circuit 44L are made of the semiconductor device 1 according to the above first embodiment. In this embodiment, the spike phenomenon occurring in the low-side transistor LQ can be prevented. The configuration, operation, and effect other than the foregoing in this embodiment are the same as those in the above sixth embodiment.

In the sixth to eighth embodiment, the semiconductor device 1 according to the above first embodiment is illustratively used as a switching device constituting the output circuit 43. However, the invention is not limited thereto, but the semiconductor device according to any of the second to fifth embodiment may be used in the sixth to eighth embodiment. Furthermore, in the sixth embodiment, semiconductor devices according to different embodiments may be used for the high-side transistor HQ and the snubber circuit 44H and for the low-side transistor LQ and the snubber circuit 44L.

Next, a ninth embodiment of the invention is described.

Figure 14:
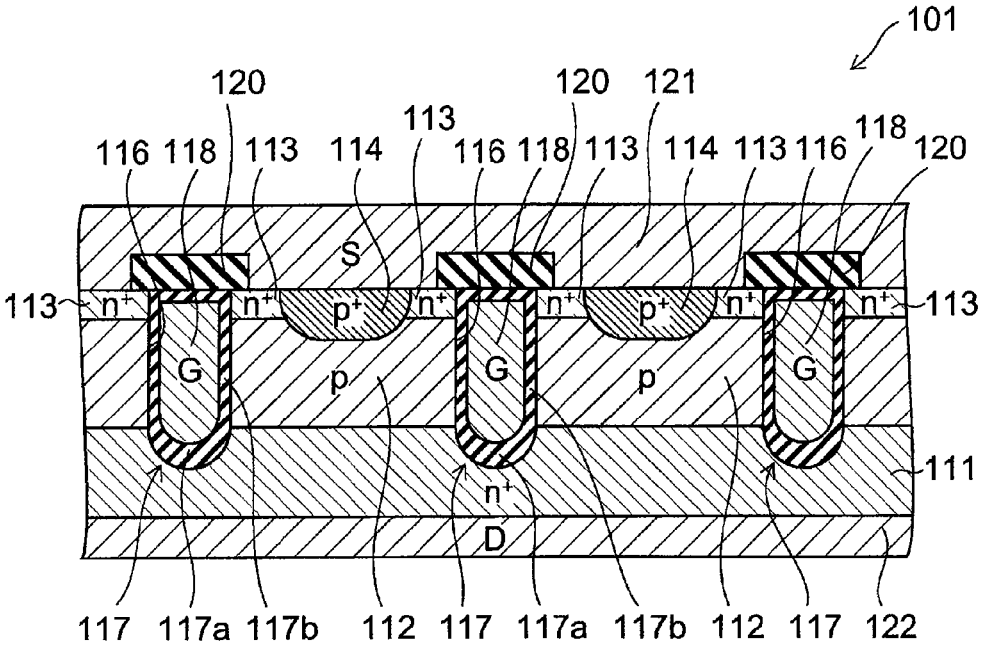
FIG. 14 is a cross-sectional view illustrating a semiconductor device according to a ninth embodiment of the invention.

FIG. 14 is a cross-sectional view illustrating a semiconductor device according to this embodiment.

The semiconductor device according to this embodiment is a vertical power MOSFET.

As shown in FIG. 14, the semiconductor device 101 according to this embodiment includes a semiconductor substrate having $n^+$-type conductivity (hereinafter referred to as "$n^+$-type substrate 111"), and a semiconductor layer having p-type conductivity (hereinafter referred to as "p-type base layer 112") is provided on the $n^+$-type substrate 111. The $n^+$-type substrate 111 and the p-type base layer 112 are in contact with each other. Furthermore, a semiconductor region having $n^+$-type conductivity (hereinafter referred to as "$n^+$-type source region 113") is formed in part of the upper portion of the p-type base layer 112, and a $p^+$-type region 114 having $p^+$-conductivity is formed in another part of the upper portion of the p-type base layer 112. The $n^+$-type source region 113 and the $p^+$-type region 114 are in contact with each other. As viewed from above, that is, in the direction perpendicular to the upper surface of the p-type base layer 112, the $n^+$-type source region 113 and the $p^+$-type region 114 are each shaped like a stripe and alternately arranged.

In the semiconductor device 101, a trench 116 is formed from the upper surface side of the $n^+$-type source region 113. The trench 116 penetrates through the $n^+$-type source region 113 and the p-type base layer 112 and reaches an upper portion of the $n^+$-type substrate 111. As viewed from above, the trench 116 extends like a stripe in the extending direction of the $n^+$-type source region 113. A gate dielectric film 117 is formed entirely on the inner surface of the trench 116, and a trench gate electrode 118 is buried inside the trench 116. Thus, the trench gate electrode 118 is insulated from the $n^+$-type substrate 111, the p-type base layer 112, and the $n^+$-type source region 113 by the gate dielectric film 117. The bottom of the trench gate electrode 118 is located below the interface between the $n^+$-type substrate 111 and the p-type base layer 112.

A dielectric film 120 is provided in the immediately over-lying region and its surroundings of the trench 116 on the upper surface of the p-type base layer 112. Furthermore, on the upper surface of the p-type base layer 112, a source electrode 121 is provided so as to cover the dielectric film 120. The source electrode 121 is in contact with the $n^+$-type source region 113 and the $p^+$-type region 114 provided in the upper portion of the p-type base layer 112, and hence connected to the $n^+$-type source region 113 and the $p^+$-type region 114, but isolated from the trench gate electrode 118 by the dielectric film 120. Furthermore, a gate electrode (not shown) connected to the trench gate electrode 118 is provided in another region on the upper surface of the p-type base layer 112.

On the other hand, a drain electrode 122 is provided entirely on the lower surface of the $n^+$-type substrate 111. The drain electrode 122 is in contact with the lower surface of the $n^+$-type substrate 111, and hence connected to the $n^+$-type substrate 111. Thus, in the semiconductor device 101, a semiconductor portion, which is composed of the $n^+$-type substrate 111, the p-type base layer 112, the $n^+$-type source region 113, and the $p^+$-type region 114, is sandwiched between the drain electrode 122 and the source electrode 121, and the trench gate electrode 118 is buried in this semiconductor portion.

In this embodiment, the thickness of the portion 117a of the gate dielectric film 117 formed on the bottom surface of the trench 116 is different from the thickness of the portion 117b of the gate dielectric film 117 formed on the side surface of the trench 116. More specifically, the thickness of the portion 117a on the bottom surface is thicker than the thickness of the thinnest portion of the portion 117b on the side surface. Here, the bottom surface of the trench 116 refers to the surface of the trench 116 facing the drain electrode 122, and the side surface of the trench 116 refers to the surface other than the bottom surface, that is, the surface generally parallel to the direction from the drain electrode 122 to the source electrode 121.

By way of example, the $n^+$-type substrate 111, the p-type base layer 112, the $n^+$-type source region 113, and the $p^+$-type region 114 are formed from single crystal silicon (Si) doped with donors such as phosphorus (P) or acceptors such as boron (B), the gate dielectric film 117 is formed from silicon oxide, and the trench gate electrode 118 is formed from polycrystalline silicon. The source electrode 121 and the drain electrode 122 are formed from a metal such as copper (Cu) or aluminum (Al), or an alloy thereof. The $n^+$-type substrate 111 has a donor concentration of e.g. $1\times10^{19}$ $cm^{-3}$ or more.

Next, a method for manufacturing a semiconductor device according to this embodiment is described.

FIGS. 15A to 15C and 16A to 16C are process cross-sectional views illustrating the method for manufacturing a semiconductor device according to this embodiment.

Figure 15A:
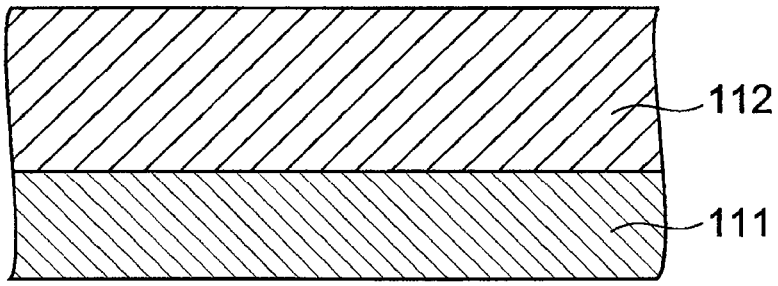
FIGS. 15A to 15C are process cross-sectional views illustrating a method for manufacturing a semiconductor device according to the ninth embodiment.

First, as shown in FIG. 15A, an $n^+$-type substrate 111 illustratively made of single crystal silicon is prepared. On this $n^+$-type substrate 111, n-type silicon is epitaxially grown to form an epitaxial layer. Next, boron ions (B+) are ion-implanted into this n-type epitaxial layer and diffused by heat treatment to form a p-type base layer 112 that reaches the $n^+$-type substrate 111.

Figure 15B:
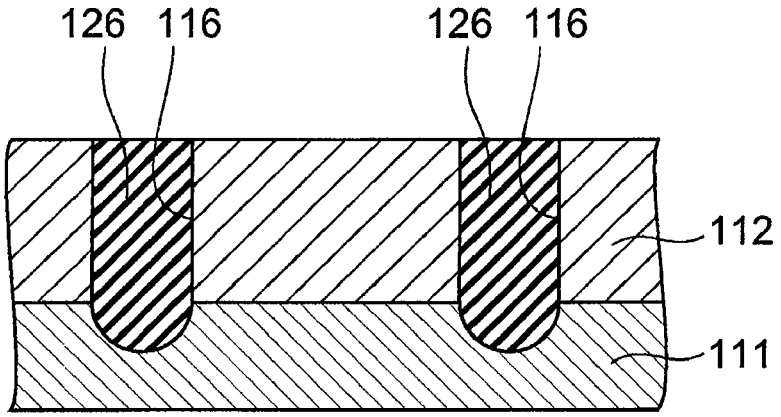

Next, as shown in FIG. 15B, a trench 116 is formed from the upper surface side of the p-type base layer 112 so as to penetrate through the p-type base layer 112 and reach the $n^+$-type substrate 111. Then, a dielectric material 126, such as silicon oxide, is buried inside the trench 116.

Figure 15C:
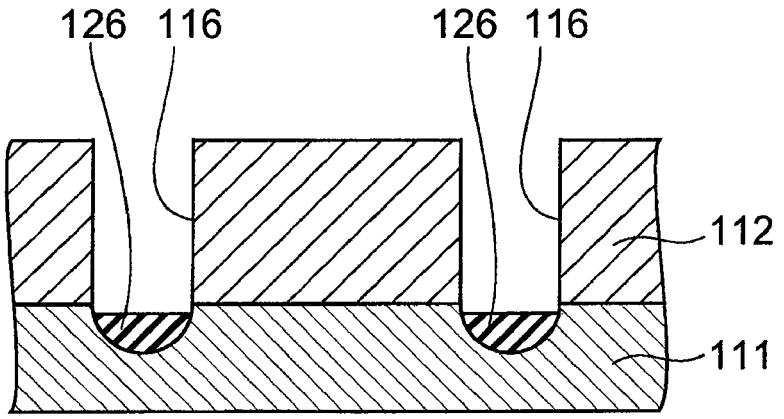

Next, as shown in FIG. 15C, the dielectric material 126 buried in an upper portion of the trench 116 is removed, with the dielectric material 126 left only in a lower portion of the trench 116. Here, the position of the upper surface of the remaining dielectric material 126 is located below the interface between the $n^+$-type substrate 111 and the p-type base layer 112.

Figure 16A:
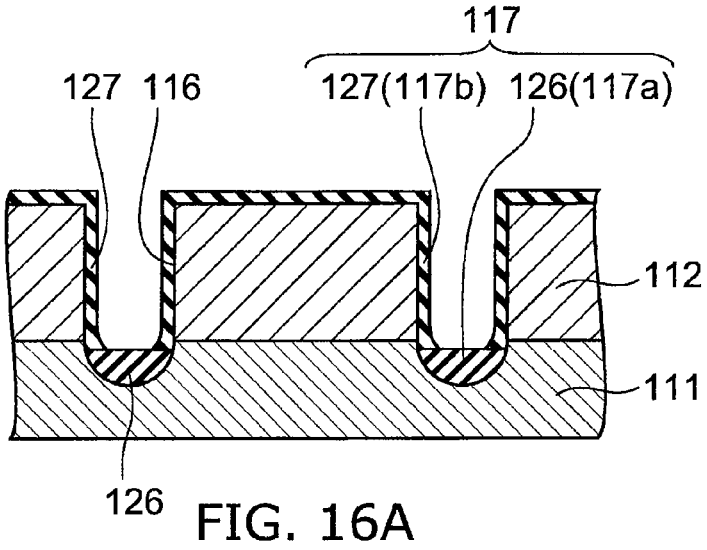
FIGS. 16A to 16C are process cross-sectional views illustrating a method for manufacturing a semiconductor device according to the ninth embodiment.

Next, as shown in FIG. 16A, a thermal oxide film 127 is formed on the inner surface of the trench 116 by, for example, heat treatment in an oxidizing atmosphere. Thus, the dielectric material 126 and the thermal oxide film 127 are integrated into a gate dielectric film 117. Here, the dielectric material 126 constitutes the portion 117a of the gate dielectric film 117 on the bottom surface of the trench 116, and the thermal oxide film 127 constitutes the portion 117b of the gate dielectric film 117 on the side surface of the trench 116, with the thickness of the portion 117a being thicker than the thickness of the portion 117b. It is noted that on the inner surface of the trench 116, instead of forming the thermal oxide film 127, it is also possible to deposit a dielectric film by CVD (chemical vapor deposition), for example.

Figure 16B:
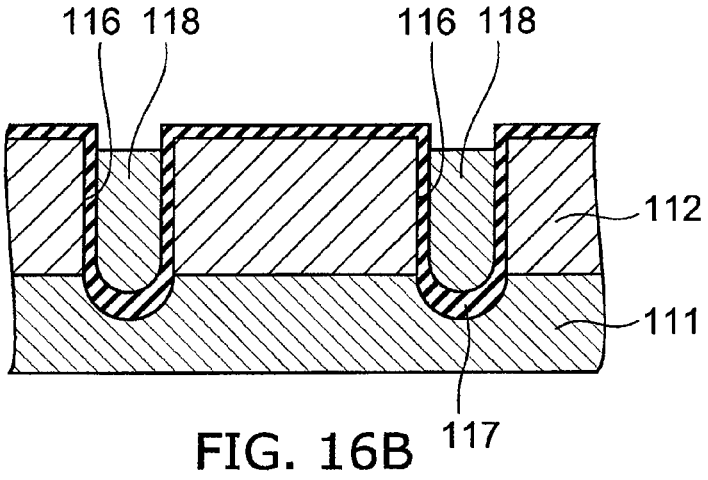

Next, as shown in FIG. 16B, polycrystalline silicon, for example, is buried in the trench 116 to form a trench gate electrode 118.

Figure 16C:
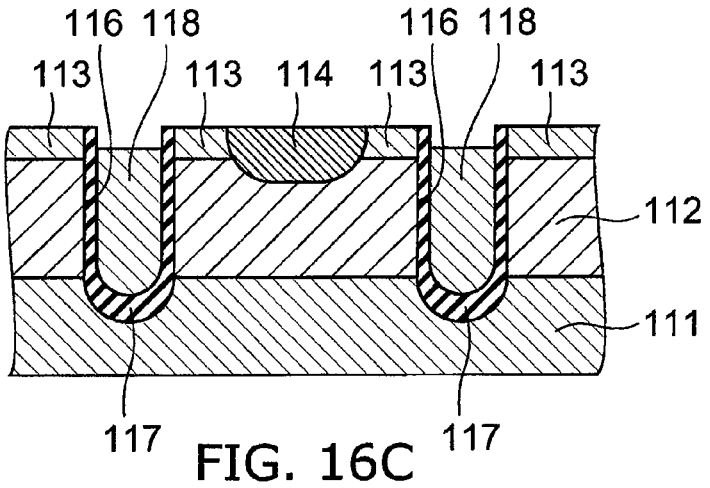

Next, as shown in FIG. 16C, the region of the upper portion of the p-type base layer 112 in contact with the trench 116 is doped with donors such as phosphorus to form an $n^+$-type source region 113. Furthermore, another region of the upper portion of the p-type base layer 112 is doped with acceptors such as boron to form a $p^+$-type region 114.

Next, as shown in FIG. 14, a dielectric film 120 is formed in the immediately overlying region and its surroundings of the trench 116 on the upper surface of the p-type base layer 112. Next, on the upper surface of the p-type base layer 112, a source electrode 121 is formed so as to cover the dielectric film 120 and be in contact with the $n^+$-type source region 113 and the $p^+$-type region 114. Furthermore, a gate electrode (not shown) is formed in another region on the upper surface of the p-type base layer 112. On the other hand, a drain electrode 122 is formed entirely on the lower surface of the $n^+$-type substrate 111.

Next, the function and effect of this embodiment are described.

In the semiconductor device 101 according to this embodiment, the $n^+$-type substrate 111 is in contact with the p-type base layer 112, and a buffer layer having a lower donor concentration than the $n^+$-type substrate 111 is not provided between the $n^+$-type substrate 111 and the p-type base layer 112. Hence, this embodiment is free from the problem of varied characteristics of the semiconductor device 101 due to the varied thickness of the buffer layer. Here, the buffer layer refers to an $n^-$-type silicon layer having a donor concentration of $1\times10^{17}$ $cm^{-3}$ or less, for example.

Furthermore, because of the absence of the buffer layer, the breakdown voltage of the semiconductor device 101 is determined by the thickness of the gate dielectric film 117. That is, the thickness of the portion 117a of the gate dielectric film 117 provided on the bottom surface of the trench 116 determines the breakdown voltage between the trench gate electrode 118 and the drain electrode 122, and the thickness of the portion 117b of the gate dielectric film 117 provided on the side surface of the trench 116 determines the breakdown voltage between the trench gate electrode 118 and the source electrode 121. However, if the thickness of the portion 117b is excessively increased, the electric field effect of the trench gate electrode 118 on the p-type base layer 112 decreases, and the response of the MOSFET is deteriorated.

In this embodiment, because the thickness of the portion 117a is different from the thickness of the portion 117b, the gate-drain breakdown voltage and the gate-source breakdown voltage can be set independently. Thus, the breakdown voltage of the semiconductor device 101 can be optimized. For example, by selecting the thickness of the portion 117a to be larger than the thickness of the portion 117b, the gate-drain breakdown voltage can be increased while ensuring adequate response of the MOSFET. By way of example, the thickness of the portion 117a can be set to 50 to 100 nm (nanometers) to ensure a breakdown voltage rated 15 V, and the thickness of the portion 117b can be set to 15 to 20 nm to realize operation at a voltage of 5 V.

Next, a variation of the ninth embodiment is described.

This variation is different from the above ninth embodiment in the method for manufacturing the gate dielectric film.

Figure 17A:
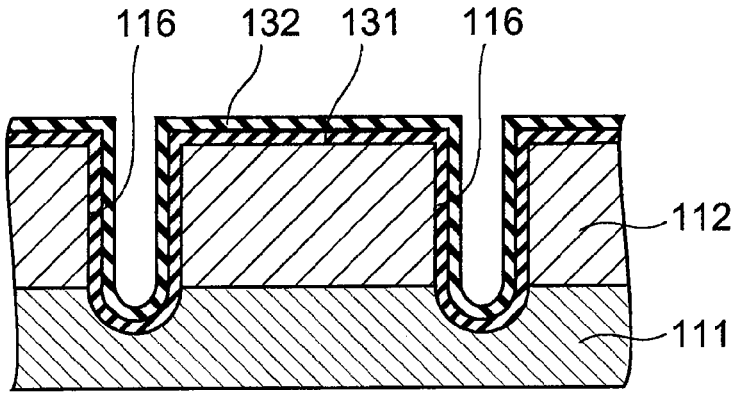
FIGS. 17A to 17C are process cross-sectional views illustrating a method for manufacturing a semiconductor device according to a variation of the ninth embodiment.
Figure 17B:
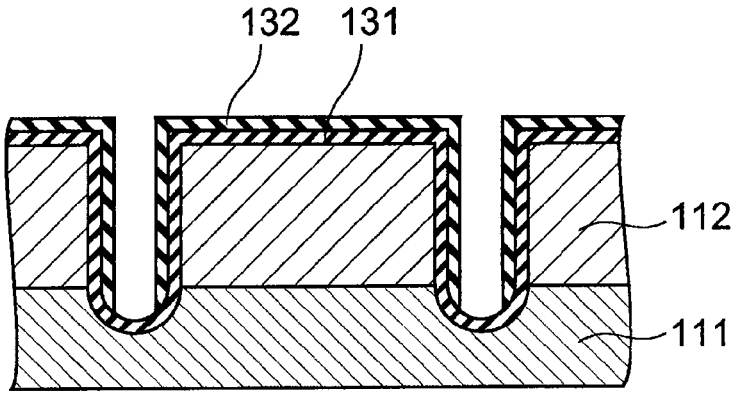
Figure 17C:
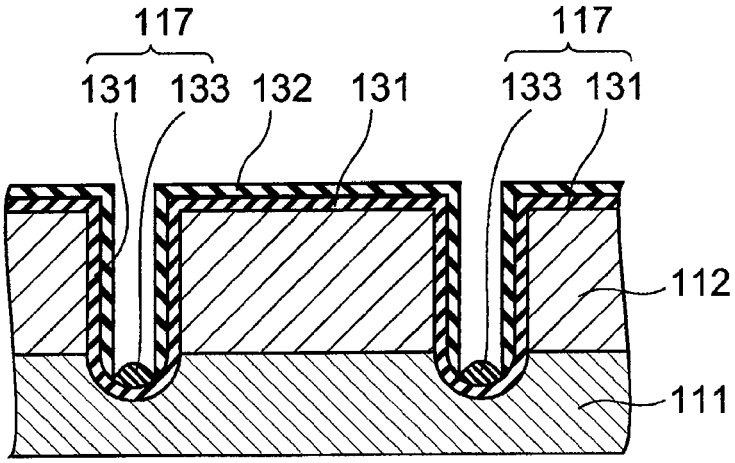

FIGS. 17A to 17C are process cross-sectional views illustrating the method for manufacturing a semiconductor device according to this variation.

First, by the method described with reference to FIG. 15A, a p-type base layer 112 is formed on the $n^+$-type substrate 111. Next, as shown in FIG. 17A, a trench 116 is formed, a silicon oxide film 131 is formed on the inner surface of the trench 116, and a silicon nitride film 132 is formed on the silicon oxide film 131.

Next, as shown in FIG. 17B, RIE (reactive ion etching) or other dry etching is performed to remove the portion of the silicon nitride film 132 formed on the bottom surface of the trench 116. Thus, on the bottom surface of the trench 116, the silicon oxide film 131 is exposed.

Next, as shown in FIG. 17C, heat treatment is performed in an oxidizing atmosphere. Thus, thermal oxidation proceeds in the exposed portion of the silicon oxide film 131, and a thick thermal oxide film 133 is formed at the bottom of the trench 116. Subsequently, the silicon nitride film 132 is removed. Thus, a gate dielectric film 117 is formed from the silicon oxide film 131 and the thermal oxide film 133. Here, the portion 117a of the gate dielectric film 117 is formed from the silicon oxide film 131 and the thermal oxide film 133 to be relatively thick, whereas the portion 117b is formed from the thermal oxide film 133 to be relatively thin. The subsequent process of the manufacturing method is the same as that of the above ninth embodiment.

Also according to this variation, it is possible to form a gate dielectric film 117 in which the thickness of the portion 117a is different from the thickness of the portion 117b. The configuration, function, and effect other than the foregoing in this variation are the same as those in the above ninth embodiment.

Next, a tenth embodiment of the invention is described.

Figure 18:
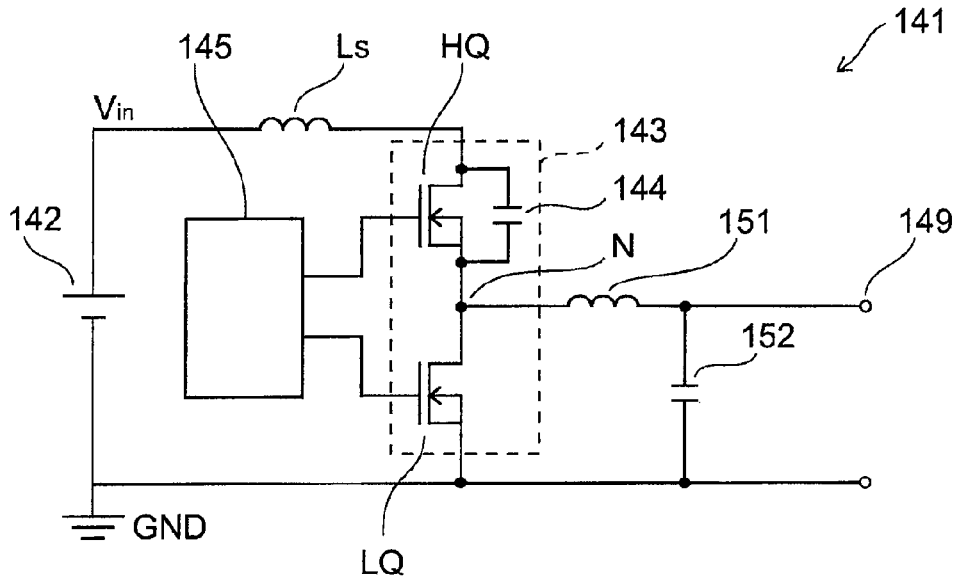
FIG. 18 is a circuit diagram illustrating a DC-DC converter according to a tenth embodiment of the invention.

FIG. 18 is a circuit diagram illustrating a DC-DC converter according to this embodiment.

Figure 19:
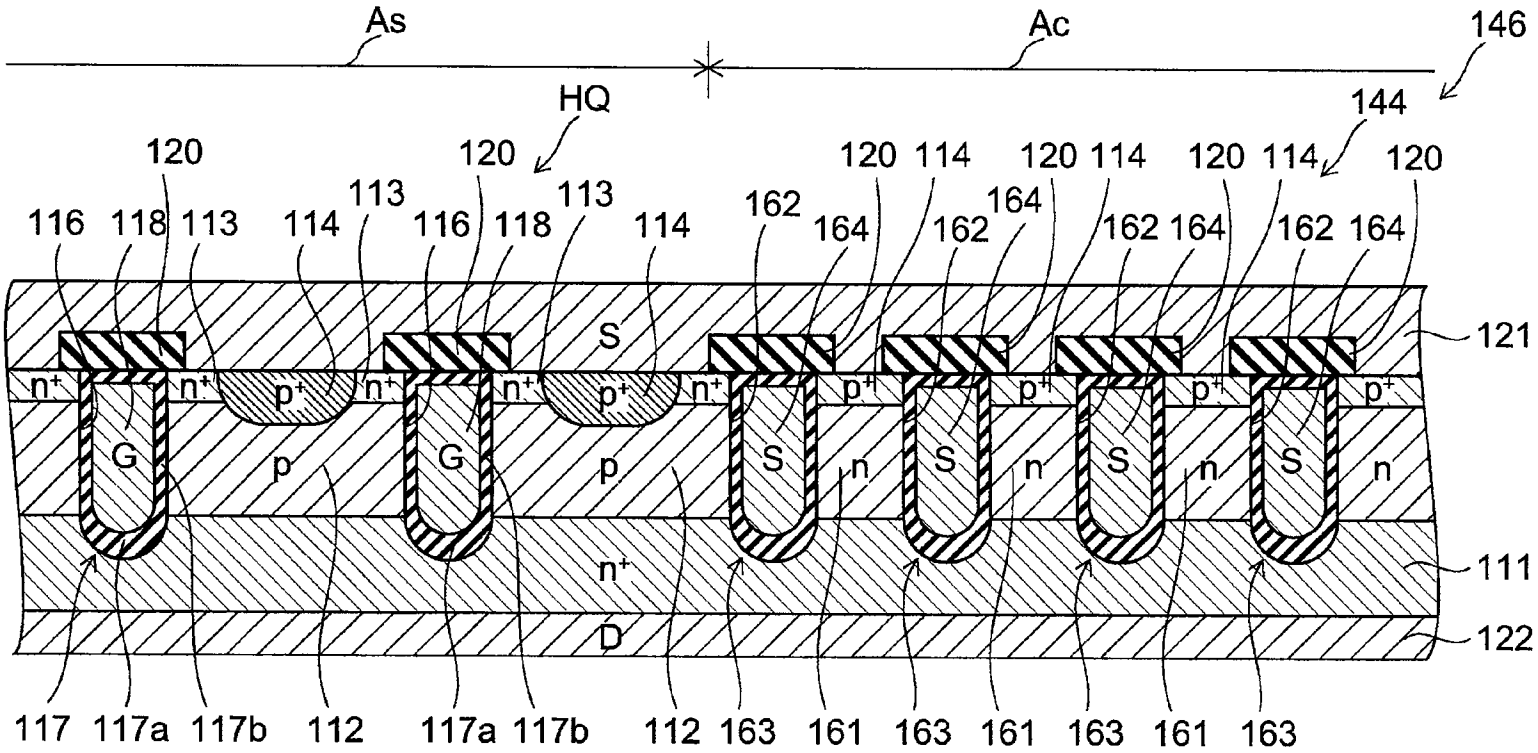
FIG. 19 is a cross-sectional view illustrating a semiconductor device according to the tenth embodiment.

FIG. 19 is a cross-sectional view illustrating a semiconductor device according to this embodiment.

As shown in FIG. 18, the DC-DC converter 141 according to this embodiment includes a DC power supply 142. The potential of the negative electrode of the DC power supply 142 is a negative reference potential, such as the ground potential GND. The potential of the positive electrode of the DC power supply 142 is a positive reference potential, such as the input potential $V_{in}$. An output circuit 143 is connected between the positive electrode and the negative electrode of the DC power supply 142, that is, between the input potential $V_{in}$ and the ground potential GND. In the output circuit 143, a high-side transistor HQ illustratively made of an N-type MOSFET and a low-side transistor LQ illustratively made of an N-type MOSFET are connected in series. Thus, the input potential $V_{in}$ is applied to the drain of the high-side transistor HQ, the source of the high-side transistor HQ is connected to the drain of the low-side transistor LQ, and the ground potential GND is applied to the source of the low-side transistor LQ.

Furthermore, a capacitor 144 is connected in parallel to the high-side transistor HQ. The capacitance of the capacitor 144 is illustratively 6000 pF or less. Upon operation of the DC-DC converter 141, a stray inductance Ls occurs in the current path composed of the DC power supply 142, the high-side transistor HQ, and the low-side transistor LQ. This is described later in more detail.

The DC-DC converter 141 further includes a control circuit 145 for controlling the output circuit 143. The control circuit 145 controls the gate potential of the high-side transistor HQ and the gate potential of the low-side transistor LQ to switch conduction/non-conduction of each of the transistors HQ and LQ. The control circuit 145 illustratively includes a PWM (pulse width modulation) control circuit (not shown) for outputting a control signal and a plurality of stages of CMOS circuits (not shown) for amplifying the control signal outputted from the PWM control circuit.

Moreover, the DC-DC converter 141 includes an inductor 151 and a capacitor 152. The inductor 151 is connected between the output terminal 149 and the junction N of the high-side transistor HQ and the low-side transistor LQ, and the capacitor 152 is connected between the output terminal 149 and the ground potential GND. Thus, the inductor 151 and the capacitor 152 constitute an LC circuit.

Furthermore, as shown in FIG. 19, in the DC-DC converter 141, the high-side transistor HQ and the capacitor 144 are formed on the same semiconductor chip 146. That is, the semiconductor chip 146 includes a switch region As and a capacitor region Ac. The high-side transistor HQ is formed in the switch region As, and the capacitor 144 is formed in the capacitor region Ac. The configuration of the high-side transistor HQ is the same as in the semiconductor device 101 according to the above eighth embodiment.

On the other hand, in the capacitor region Ac of the semiconductor chip 146, an n-type epitaxial layer 161 is provided on the $n^+$-type substrate 111. The n-type epitaxial layer 161 is illustratively a portion of the n-type epitaxial layer formed on the $n^+$-type substrate 111 in the process shown in FIG. 15A in the above eighth embodiment, the portion being not doped with boron ions. A $p^+$-type region 114 is formed in an upper portion of the n-type epitaxial layer 161.

Furthermore, in the capacitor region Ac, a trench 162 is formed from above, that is, from the upper surface side of the $p^+$-type region 114. The trench 162 penetrates through the $p^+$-type region 114 and the n-type epitaxial layer 161 and reaches an upper portion of the $n^+$-type substrate 111. Thus, around the trench 162 on the $n^+$-type substrate 111, the n-type epitaxial layer 161 is formed in contact with the $n^+$-type substrate 111. The trench 162 is illustratively formed in the same process as the trench 116 of the switch region As, and the depth of the trench 116 is equal to the depth of the trench 162. That is, in the height direction, the bottom position of the trench 116 is equal to the bottom position of the trench 162.

Furthermore, a capacitive dielectric film 163 is formed on the inner surface of the trench 162. The capacitive dielectric film 163 is formed in the same process as the gate dielectric film 117 of the switch region As, and the portion 163a on the bottom surface of the trench 162 is thicker than the portion 163b on the side surface of the trench 162. Furthermore, a trench source electrode 164 is provided in the trench 162. The trench source electrode 164 is illustratively formed in the same process as the trench gate electrode 118 of the switch region As. However, the trench source electrode 164 is connected not to the gate electrode (not shown), but to the source electrode 121.

Next, the function and effect of this embodiment are described.

Figure 20:
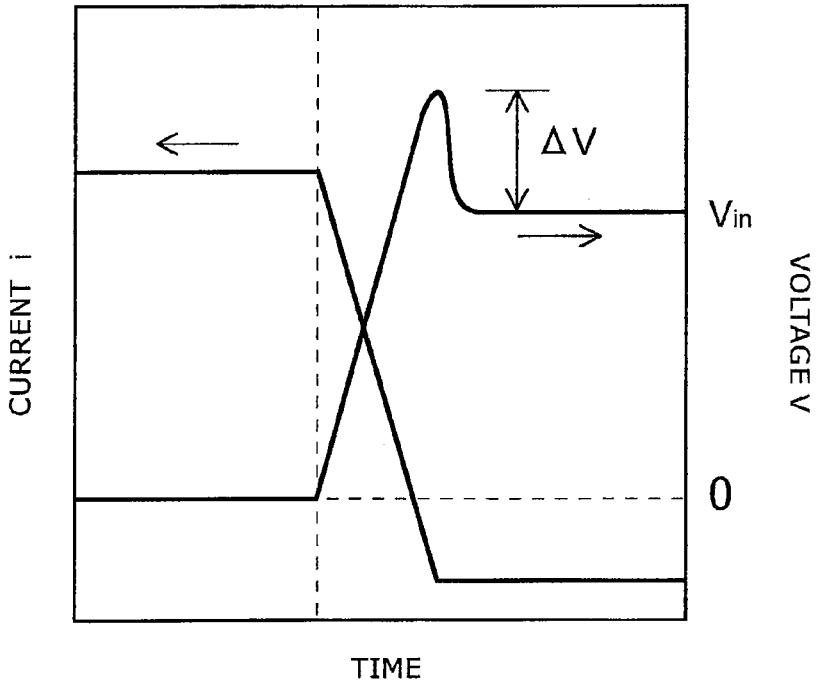
FIG. 20 is a graph illustrating the behavior of the high-side transistor at turn-off.

FIG. 20 is a graph illustrating the behavior of the high-side transistor at turn-off, where the horizontal axis represents time, and the vertical axis represents voltage applied to and current flowing through the high-side transistor.

Upon operation of the DC-DC converter 141, a stray inductance Ls occurs in the current path. This causes a spike phenomenon, as shown in FIG. 20, in which the voltage V applied to the high-side transistor HQ temporarily jumps when the high-side transistor HQ is turned off. As given by the following equation, the spike amount ΔV at this time is proportional to the stray inductance Ls and the rate of change of the current, di/dt. It is noted that the following equation is the same as the equation shown in the above first embodiment.

$$\Delta V = -Ls \times (di/dt)$$

When the voltage V reaches the breakdown voltage of the high-side transistor HQ by the spike phenomenon, an avalanche breakdown occurs in the vicinity of the trench gate electrode 118 in the p-type base layer 112, causing a large switching loss.

This switching loss may be reduced by a method of connecting a capacitor between the source and the drain of the high-side transistor HQ to form a snubber circuit. However, if this snubber circuit is formed in a semiconductor chip that is separate from the semiconductor chip including the high-side transistor HQ, a large stray inductance occurs between the high-side transistor HQ and the snubber circuit. Thus, little current flows through the snubber circuit, and the effect of reducing the switching loss is hardly achieved. Furthermore, because the snubber circuit is external to the high-side transistor HQ, the number of components increases, and the cost of the DC-DC converter 141 increases.

In contrast, according to this embodiment, the trench source electrode 164 is connected to the source electrode 121, the $n^+$-type substrate 111 and the n-type epitaxial layer 161 are connected to the drain electrode 122, and the trench source electrode 164 is separated from the $n^+$-type substrate 111 and the n-type epitaxial layer 161 by the capacitive dielectric film 163. Thus, a capacitor 144 is formed between the source and the drain of the high-side transistor HQ and serves as a snubber circuit.

Here, because the high-side transistor HQ and the capacitor 144 are formed on the same semiconductor chip 146, the stray inductance between the high-side transistor HQ and the capacitor 144 is extremely low, allowing the spike current to efficiently flow through the capacitor 144. Consequently, the snubber circuit functions effectively.

Furthermore, the n-type epitaxial layer 161 is provided on the $n^+$-type substrate 111, and the trench 162 is formed so as to penetrate through the n-type epitaxial layer 161 and reach the $n^+$-type substrate 111. This serves to increase the electrode area of the capacitor 144 and decrease the interelectrode distance to the thickness of the capacitive dielectric film 163, so that the capacitance of the capacitor 144 can be increased.

Furthermore, the portion 163a of the capacitive dielectric film 163 formed on the bottom surface of the trench 162 is relatively thick, whereas the portion 163b formed on the side surface of the trench 162 is relatively thin. This serves to increase the capacitance of the capacitor 144 while ensuring the source-drain breakdown voltage.

Moreover, the trench 162 is formed in the same process as the trench 116, the capacitive dielectric film 163 is formed in the same process as the gate dielectric film 117, and the trench source electrode 164 is formed in the same process as the trench gate electrode 118. Thus, the capacitor 144 can be fabricated simultaneously with the high-side transistor HQ. Consequently, the fabrication cost of the semiconductor chip 146 can be reduced.

Moreover, because the capacitor 144 is not external to the high-side transistor HQ, cost increase can be prevented. The function and effect other than the foregoing in this embodiment are the same as those in the above ninth embodiment.

Next, test examples demonstrating the effect of the above tenth embodiment are described.

To begin with, a first test example is described.

In this test example, assuming the DC-DC converter 141 shown in FIGS. 18 and 19, simulation was performed to determine how the size of the capacitor 144 affects the power loss of the high-side transistor HQ.

Figure 21:
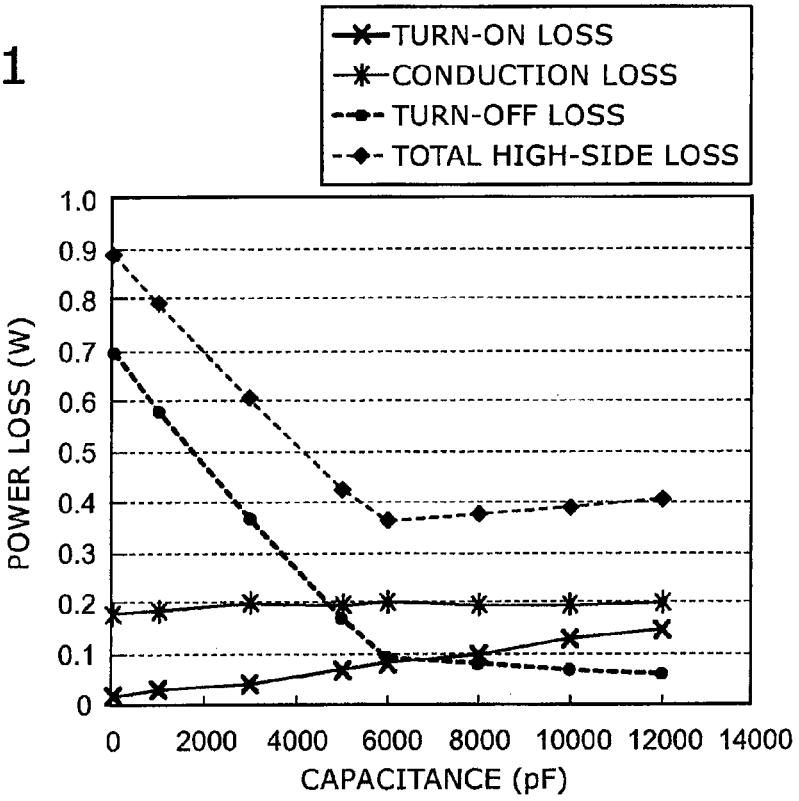
FIG. 21 is a graph illustrating the effect of the capacitance of the capacitor of the snubber circuit on the loss of the high-side transistor.

FIG. 21 is a graph illustrating the effect of the capacitance of the capacitor of the snubber circuit on the loss of the high-side transistor, where the horizontal axis represents the capacitance of the capacitor constituting the snubber circuit, and the vertical axis represents power loss.

The capacitance represented on the horizontal axis of FIG. 21 corresponds to the capacitance of the capacitor 144 shown in FIGS. 18 and 19. The horizontal axis is given in units of pF (picofarads), and the vertical axis is given in units of W (watts). In this test example, the magnitude of the stray inductance Ls was 5 nH (nanohenries), and the magnitude of the current outputted from the DC-DC converter 141 was 16 A (amperes).

As shown in FIG. 21, with the increase of capacitance of the capacitor 144 in the range of 0 to 6000 pF, the conduction loss hardly varied, and the turn-on loss slightly increased, but the turn-off loss significantly decreased and resulted in significant decrease of the total loss of the high-side transistor HQ. On the other hand, even if the capacitance was increased beyond 6000 pF, the effect of reducing the loss of the high-side transistor HQ was saturated.

In the example shown in FIG. 21, the total loss of the high-side transistor HQ for the capacitance of the capacitor 144 ranging from 6000 to 12000 pF was half or less of the total loss of the high-side transistor HQ for the capacitance being equal to 0 pF. Thus, by providing the capacitor 144, the total loss of the high-side transistor HQ was successfully reduced. However, even if the capacitance was increased above 6000 pF, the effect of reducing the loss of the high-side transistor HQ was saturated. Hence, the capacitance of the capacitor 144 is preferably 6000 pF or less.

Next, a second test example is described.

In this test example, assuming the DC-DC converter 141 shown in FIGS. 18 and 19, the efficiency of the DC-DC converter according to this embodiment was simulated. Furthermore, as a comparative example, assuming a DC-DC converter with the capacitor 144 omitted from the DC-DC converter 141, simulation was performed on similar conditions.

Figure 22:
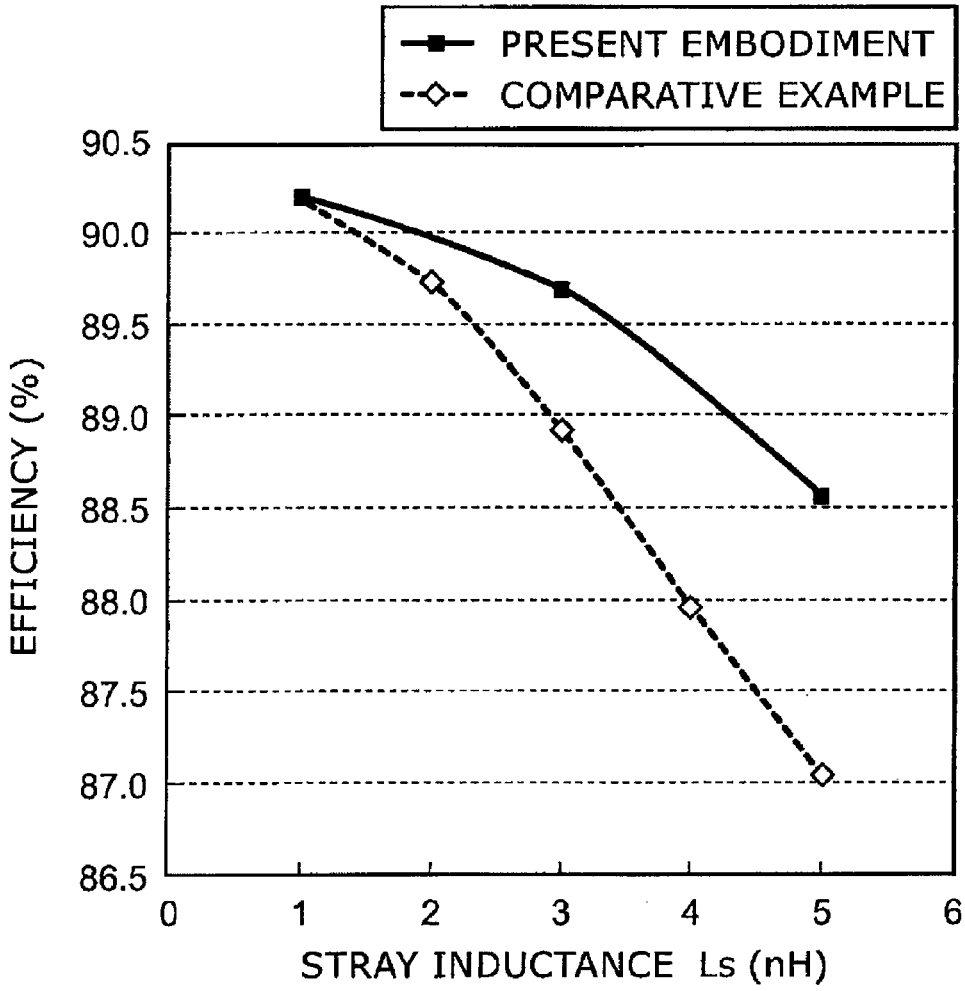
FIG. 22 is a graph illustrating the effect of the stray inductance on the efficiency of the DC-DC converter.

FIG. 22 is a graph illustrating the effect of the stray inductance on the efficiency of the DC-DC converter, where the horizontal axis represents the magnitude of the stray inductance Ls, and the vertical axis represents the efficiency of the DC-DC converter.

Here, the "efficiency" represented on the vertical axis of FIG. 22 is the ratio, expressed in percentage, of the output power to the input power of the DC-DC converter. That is, the "efficiency" is defined by the following equation:

$$\text{Efficiency (\%)}=(\text{output power})/(\text{input power})\times 100$$

In this test example, the input potential $V_{in}$ of the high-side transistor HQ was 5 V (volts), the gate potential was 5 V, the output voltage $V_{out}$ of the DC-DC converter 141 was 1.083 V, the output current was 16 A, and the frequency of the control signal outputted by the output circuit 43 was 1 MHz (megahertz).

As shown in FIG. 22, in both the DC-DC converter 141 according to this embodiment and the DC-DC converter according to the comparative example, the efficiency decreased with the increase of the stray inductance Ls. However, in the DC-DC converter 141 according to this embodiment, the decrease of efficiency was successfully reduced relative to the DC-DC converter according to the comparative example. This is considered to be the effect of the snubber circuit made of the capacitor 144.

The invention has been described with reference to the embodiments. However, the invention is not limited to these embodiments. For example, the above embodiments can be practiced in combination with each other. For example, in the semiconductor device according to the above first to fifth embodiment, like the above ninth embodiment, the thickness of the portion of the gate dielectric film formed on the bottom surface of the trench may be made larger than the thickness of the thinnest portion of the portion formed on the side surface of the trench. Furthermore, those skilled in the art can suitably modify the above embodiments by addition, deletion, or design change of the components, or by addition, omission, or condition change of the processes, and such modifications are also encompassed within the scope of the invention as long as they fall within the spirit of the invention.

The invention claimed is:

1. A semiconductor device comprising:

a semiconductor substrate of a first conductivity type;

a semiconductor layer of a second conductivity type provided in part of an upper portion of the semiconductor substrate;

a semiconductor region of the first conductivity type provided in part of an upper portion of the semiconductor layer;

a first trench formed from an upper surface side of the semiconductor region, penetrating through the semiconductor region and the semiconductor layer, and reaching the semiconductor substrate;

a second trench formed in the semiconductor substrate and outside the semiconductor layer from an upper surface side of the semiconductor substrate;

a gate dielectric film formed on an inner surface of the first trench;

a trench gate electrode provided on the gate dielectric film;

a capacitive dielectric film formed on an inner surface of the second trench;

a trench source electrode provided on the capacitive dielectric film;

a dielectric film that overlaps an upper surface of a portion of the semiconductor substrate in which the second trench is formed;

a drain electrode provided on a lower surface of the semiconductor substrate; and a source electrode provided on an upper surface of the semiconductor layer, the trench source electrode extending in a direction parallel to the upper surface of the semiconductor substrate and being connected to the source electrode through a portion of the trench source electrode extending in the parallel direction, wherein end portions of the trench source electrode in the parallel direction are connected to the source electrode.

2. The device according to claim 1, wherein as viewed in a direction perpendicular to the upper surface of the semiconductor substrate, the trench source electrode is shaped like a stripe extending in the parallel direction.

3. The device according to claim 1, wherein the semiconductor substrate includes:

a low-resistance layer of the first conductivity type; and a high-resistance layer of the first conductivity type formed on the low-resistance layer and having a higher resistivity than the low-resistance layer, and the semiconductor layer of the second conductivity type is formed in part of an upper portion of the high-resistance layer.

4. A semiconductor device comprising:

a semiconductor substrate of a first conductivity type;

a semiconductor layer of a second conductivity type provided in part of an upper portion of the semiconductor substrate;

a semiconductor region of the first conductivity type provided in part of an upper portion of the semiconductor layer;

a first trench formed from an upper surface side of the semiconductor region, penetrating through the semiconductor region and the semiconductor layer, and reaching the semiconductor substrate;

a second trench formed in the semiconductor substrate and outside the semiconductor layer from an upper surface side of the semiconductor substrate;

a gate dielectric film formed on an inner surface of the first trench;

a trench gate electrode provided on the gate dielectric film;

a capacitive dielectric film formed on an inner surface of the second trench;

a trench source electrode provided on the capacitive dielectric film;

a dielectric film that overlaps an upper surface of a portion of the semiconductor substrate in which the second trench is formed;

a drain electrode provided on a lower surface of the semiconductor substrate; and a source electrode provided on an upper surface of the semiconductor layer, the trench source electrode extending in a direction parallel to the upper surface of the semiconductor substrate and being connected to the source electrode through a portion of the trench source electrode extending in the parallel direction, wherein end portions in the parallel direction and one or more intermediate portions of the trench source electrode are connected to the source electrode.

5. A semiconductor device comprising:

a semiconductor substrate of a first conductivity type;

a semiconductor layer of a second conductivity type provided in part of an upper portion of the semiconductor substrate;

a semiconductor region of the first conductivity type provided in part of an upper portion of the semiconductor layer;

a first trench formed from an upper surface side of the semiconductor region, penetrating through the semiconductor region and the semiconductor layer, and reaching the semiconductor substrate;

a second trench formed in the semiconductor substrate and outside the semiconductor layer from an upper surface side of the semiconductor substrate;

a gate dielectric film formed on an inner surface of the first trench;

a trench gate electrode provided on the gate dielectric film;

a capacitive dielectric film formed on an inner surface of the second trench;

a trench source electrode provided on the capacitive dielectric film;

a dielectric film that overlaps an upper surface of a portion of the semiconductor substrate in which the second trench is formed;

a drain electrode provided on a lower surface of the semiconductor substrate; and a source electrode provided on an upper surface of the semiconductor layer, the trench source electrode extending in a direction parallel to the upper surface of the semiconductor substrate and being connected to the source electrode through a portion of the trench source electrode extending in the parallel direction, wherein the upper surface of the portion of the semiconductor substrate that is between the second trench and a third trench, that is formed in the semiconductor substrate and outside the semiconductor layer, is not in contact with the source electrode.

*6. A semiconductor device comprising:*

*a semiconductor substrate of a first conductivity type;*

*a semiconductor layer of a second conductivity type provided in part of an upper portion of the semiconductor substrate;*

*a semiconductor region of the first conductivity type provided in part of an upper portion of the semiconductor layer;*

*a plurality of gate electrodes provided adjacent to the semiconductor layer via gate dielectric films;*

*a plurality of trenches formed in the semiconductor substrate and outside the semiconductor layer from an upper surface side of the semiconductor substrate, the trenches extending in a direction parallel to the upper surface of the semiconductor substrate;*

*capacitive dielectric films formed on inner surfaces of the trenches;*

*trench source electrodes provided in the trenches on the capacitive dielectric films;*

*two source contacts provided on end portions of the trench source electrodes extending in the direction parallel to the upper surface of the semiconductor substrate;*

*a dielectric film provided on part of the semiconductor layer; and*

*a source electrode provided on the upper surface of the semiconductor region, wherein*

*the trench source electrodes are connected to the source electrode through the source contacts.*

*7. The device according to claim 6, wherein the semiconductor region contacts the source electrode in a region of the upper surface of the semiconductor region at which the dielectric films are not provided.*

*8. The device according to claim 6, wherein the source electrode is disposed on the trench source electrodes and the capacitive dielectric films.*

*9. The device of claim 6, wherein the semiconductor substrate comprises a first portion and a second portion overlying the first portion, and the resistivity of the first and second portions is different.*

*10. The device of claim 9, wherein the plurality of trenches extend inwardly of, and terminate within, the second portion.*

*11. The device of claim 9, wherein a portion of the second portion extends between one of the trenches and the first portion.*

*12. The device of claim 6, wherein one of the two source contacts has a rectangular strip shape extending in a direction crossing the direction parallel to upper surface of the semiconductor substrate.*

* * * * *